United States Patent
Masuoka et al.

(10) Patent No.: US 8,330,089 B2
(45) Date of Patent: Dec. 11, 2012

(54) SOLID-STATE IMAGING DEVICE

(75) Inventors: Fujio Masuoka, Tokyo (JP); Hiroki Nakamura, Tokyo (JP)

(73) Assignee: Unisantis Electronics Singapore Pte Ltd., Peninsula Plaza (SG)

(*) Notice: Subject to any disclaimer, the term of this patent is extended or adjusted under 35 U.S.C. 154(b) by 261 days.

(21) Appl. No.: 12/700,294

(22) Filed: Feb. 4, 2010

(65) Prior Publication Data

US 2010/0200731 A1    Aug. 12, 2010

Related U.S. Application Data

(63) Continuation of application No. PCT/JP2007/067732, filed on Sep. 12, 2007.

(60) Provisional application No. 61/207,625, filed on Feb. 13, 2009.

(51) Int. Cl.
*H01L 27/00* (2006.01)
*H01L 31/00* (2006.01)

(52) U.S. Cl. .......... 250/208.1; 250/214.1; 257/291; 257/E27.133

(58) Field of Classification Search .......... 250/208.1, 250/214.1; 257/291, 292, 448, E27.131, 257/E27.132, E27.133
See application file for complete search history.

(56) References Cited

U.S. PATENT DOCUMENTS

| | | | |
|---|---|---|---|
| 2003/0002093 A1 | 1/2003 | Hynecek | |
| 2006/0043520 A1 | 3/2006 | Jerdev et al. | |
| 2009/0065832 A1* | 3/2009 | Masuoka et al. | 257/292 |

FOREIGN PATENT DOCUMENTS

| | | |
|---|---|---|
| EP | 2197032 A1 | 6/2010 |
| JP | 01-175775 A | 7/1989 |
| JP | 02-089368 A | 3/1990 |
| JP | 05-276442 A | 10/1993 |
| JP | 2000-244818 A | 9/2000 |
| JP | 2001-339057 A | 12/2001 |
| JP | 2002-246580 A | 8/2002 |
| JP | 2002-246581 A | 8/2002 |

(Continued)

OTHER PUBLICATIONS

Nakamura, Jun-ichi et al., "Nondestructive Readout Mode Static Induction Transistor (SIT) Photo Sensors," IEEE Transactions on Electron Devices, 1993, vol. 40, pp. 334-341.

(Continued)

*Primary Examiner* — Kevin Pyo
(74) *Attorney, Agent, or Firm* — Brinks Hofer Gilson & Lione

(57) ABSTRACT

It is intended to provide a CMOS image sensor with a high degree of pixel integration. A solid-state imaging device comprises a signal line formed on a Si substrate, an island-shaped semiconductor formed on the signal line, and a pixel selection line. The island-shaped semiconductor includes: a first semiconductor layer connected to the signal line; a second semiconductor layer located above and adjacent to the first semiconductor layer; a gate connected to the second semiconductor layer through an insulating film; and a charge storage section comprised of a third semiconductor layer connected to the second semiconductor layer and adapted, in response to receiving light, to undergo a change in amount of electric charges therein; a fourth semiconductor layer located above and adjacent to the second and third semiconductor layers. The pixel selection line is connected to the fourth semiconductor layer formed as a top portion of the island-shaped semiconductor.

14 Claims, 27 Drawing Sheets

FOREIGN PATENT DOCUMENTS

| | | |
|---|---|---|
| JP | 2004-259733 A | 9/2004 |
| WO | WO 01/22494 A1 | 3/2001 |

OTHER PUBLICATIONS

Extended European Search Report for European Application No. 07807139.6, dated Jun. 24, 2011, 10 pages.
Written Opinion of the International Searching Authority for International Application No. PCT/JP2007/067732, dated Dec. 11, 2007, 4 pages.
International Search Report for International Application No. PCT/JP2007/067732, dated Dec. 11, 2007, 2 pages.
Extended European Search Report for European Application No. 12001395.8, dated Apr. 26, 2012, 7 pages.
Examination Report for European Application No. 08722595.9, dated Jul. 11, 2012, 4 pages.
Examination Report in corresponding European Application No. 07 807 139.6, dated Jun. 11, 2012, 4 pages.

* cited by examiner

FIG.3
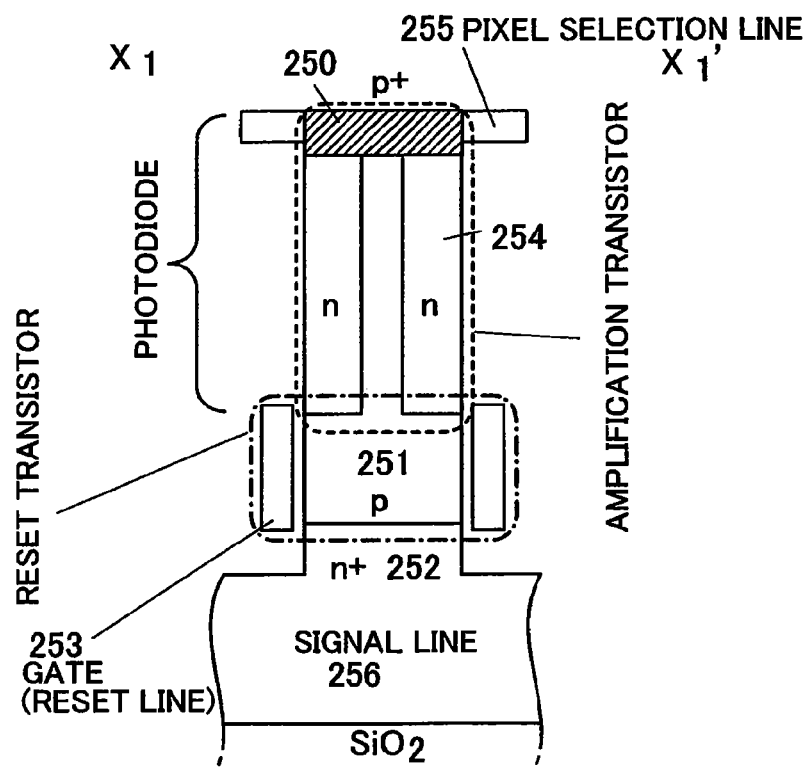
(a)
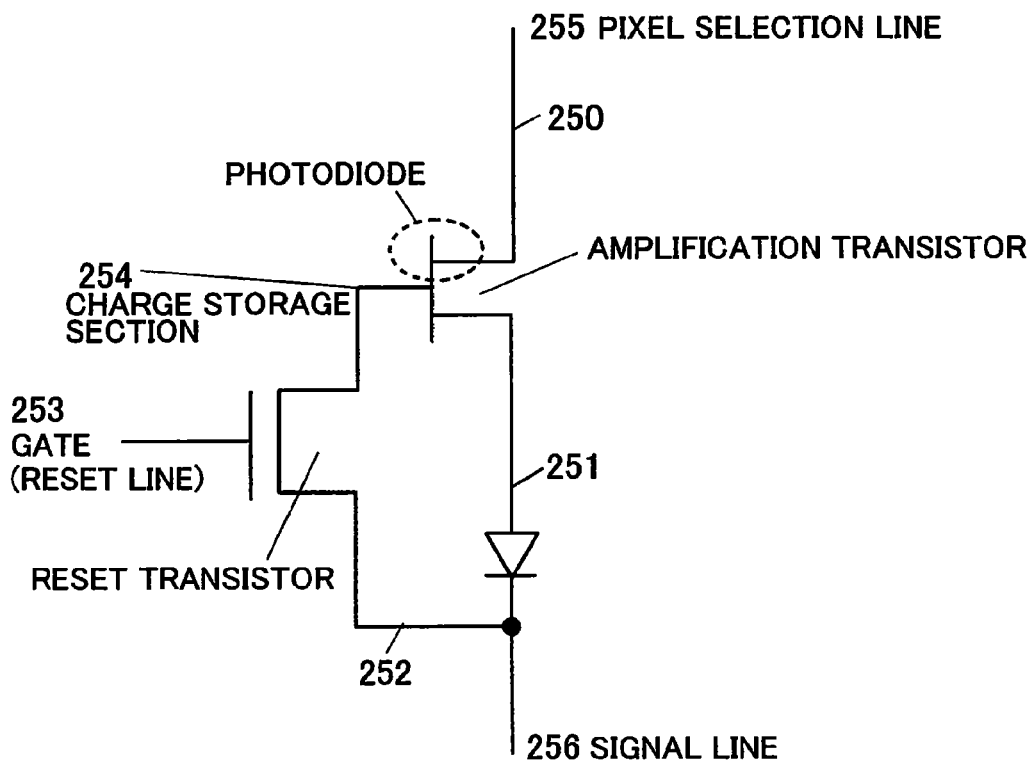
(b)

FIG.4
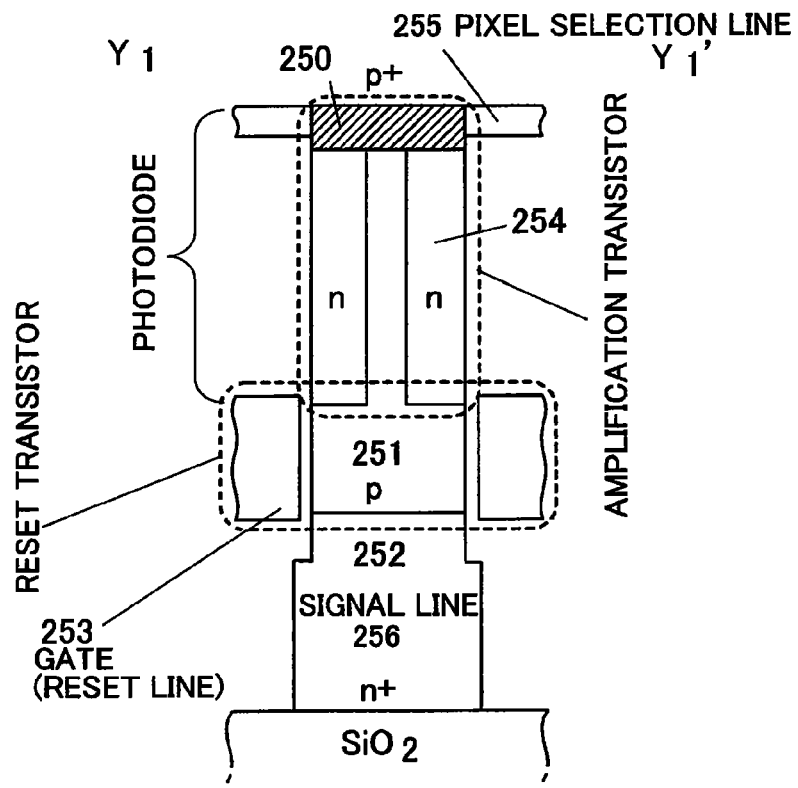
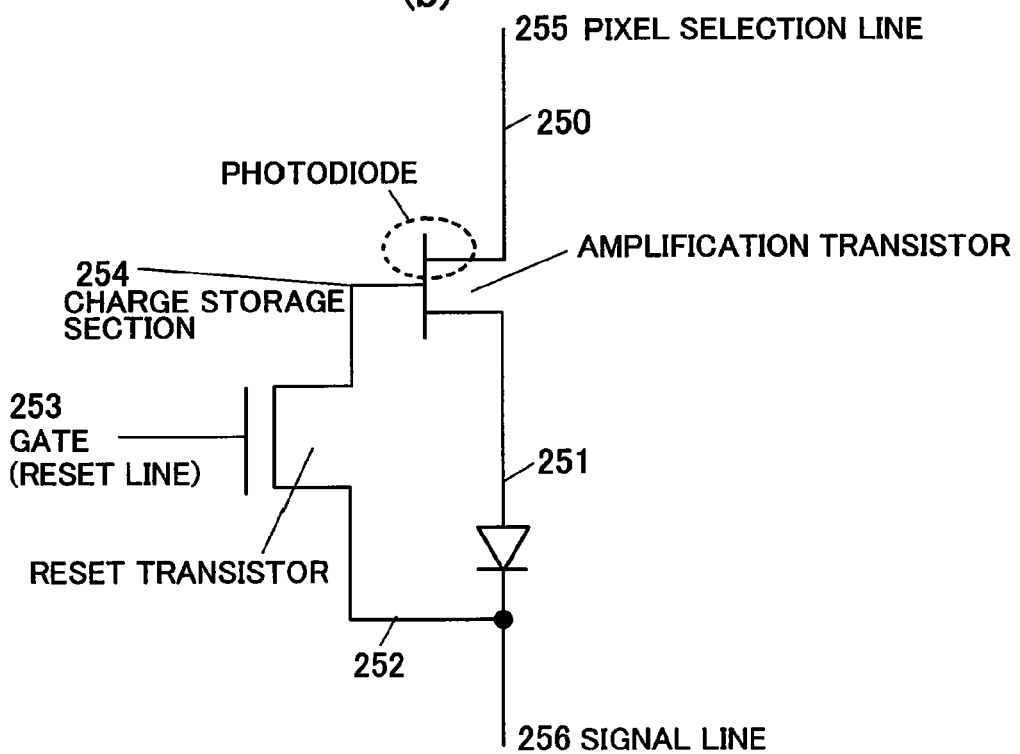

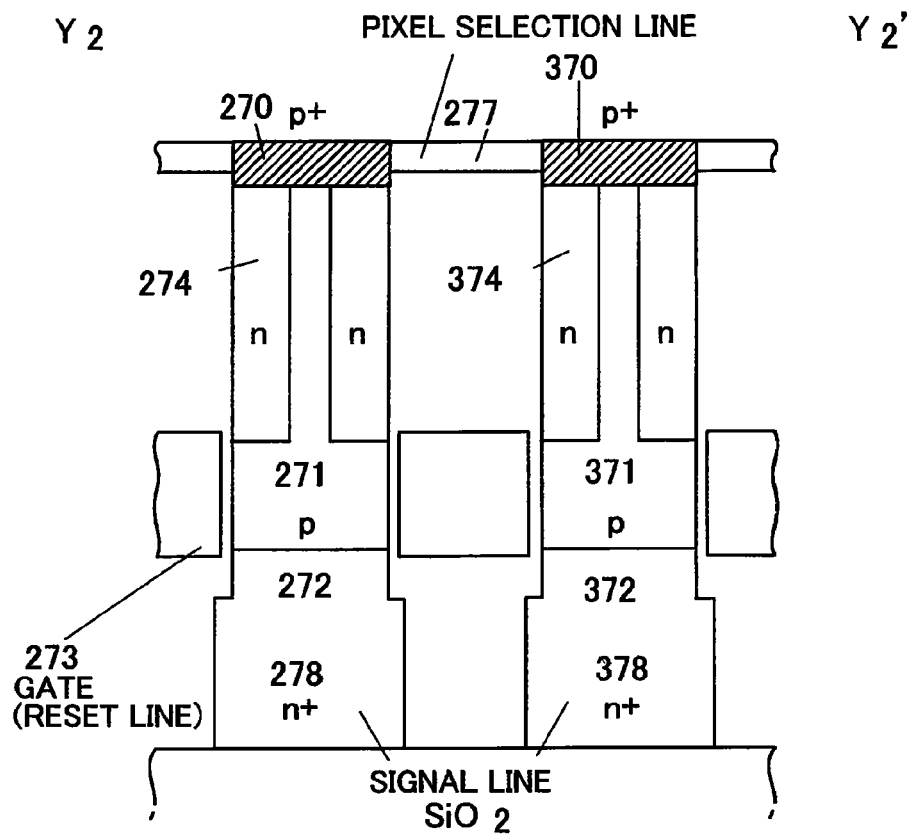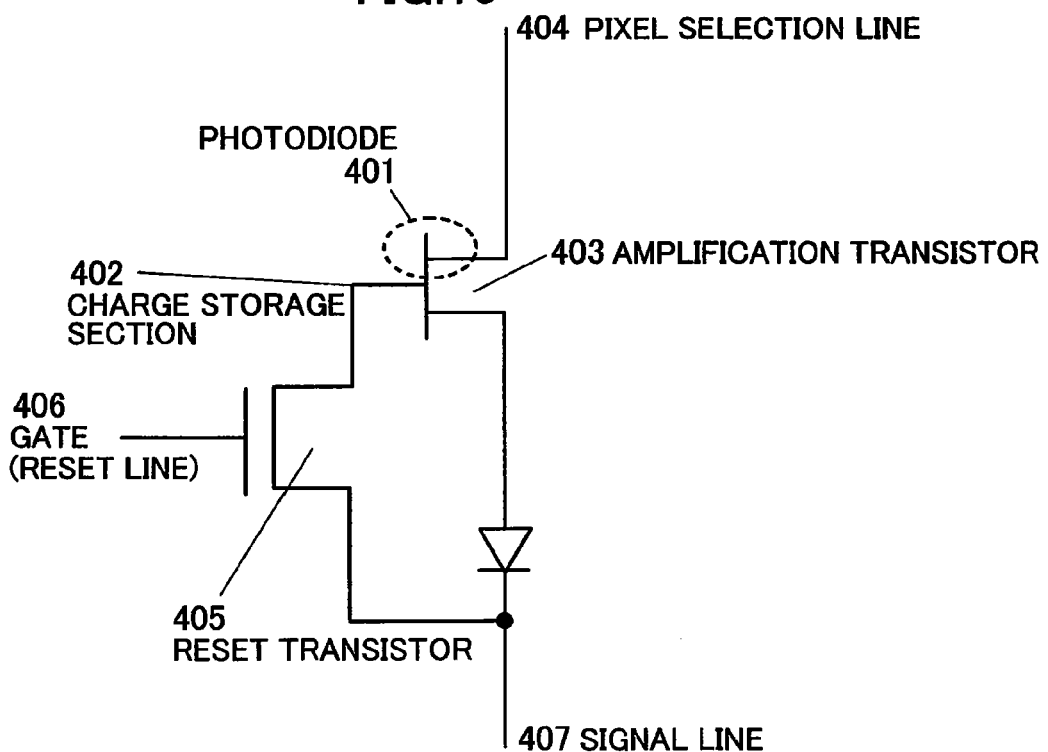

FIG.13
(a)
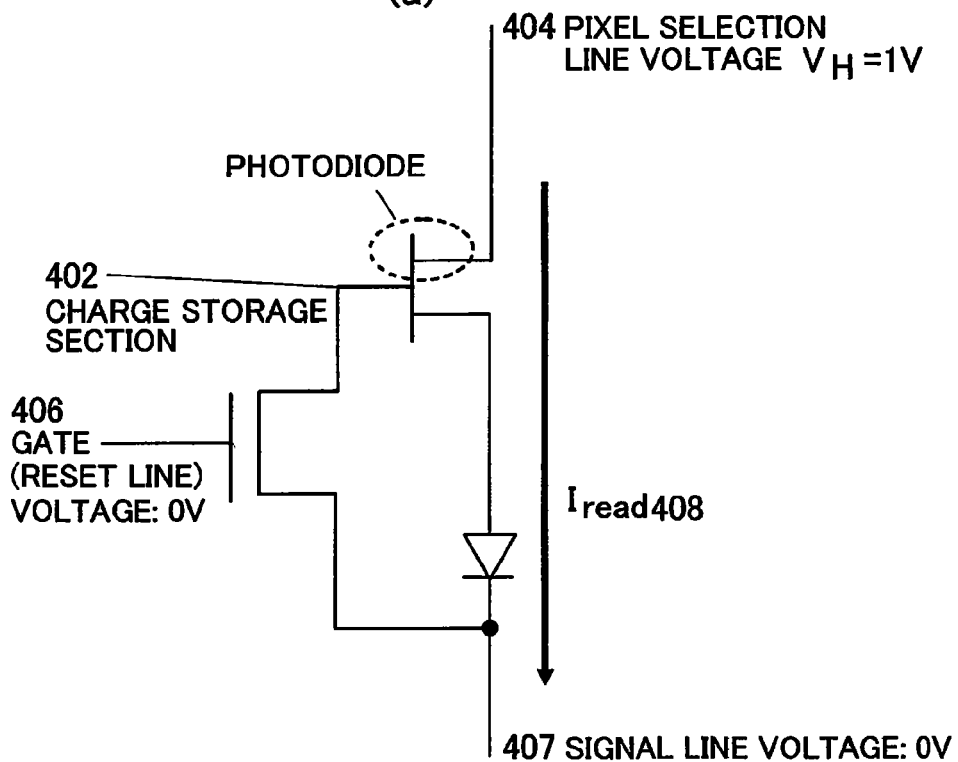
(b)
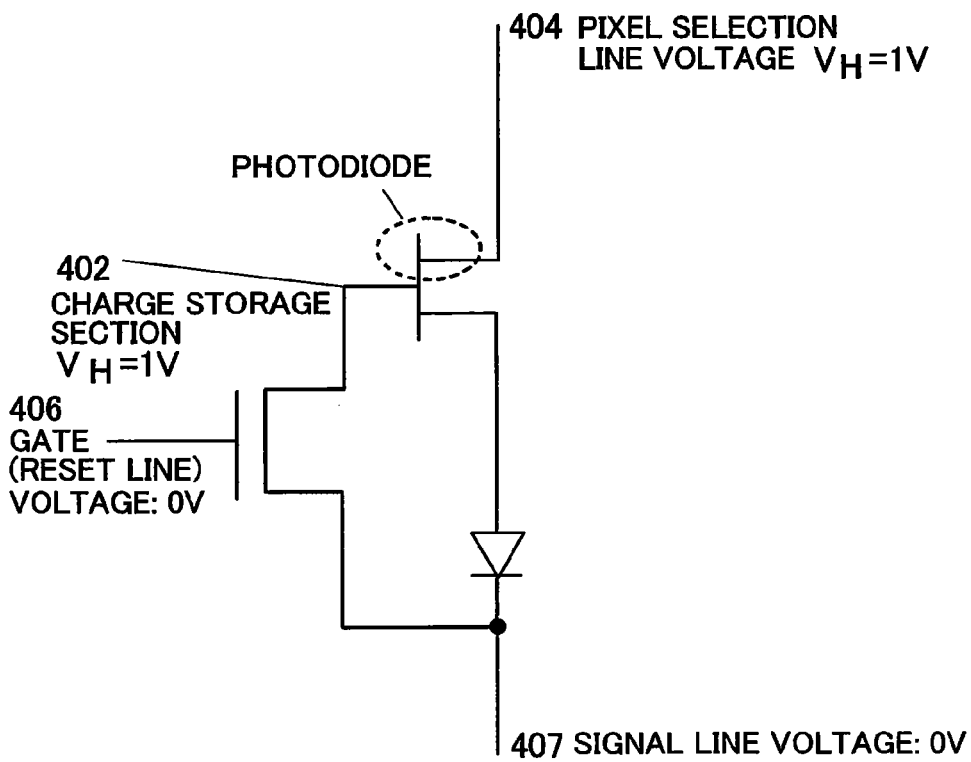

FIG.16
(a)
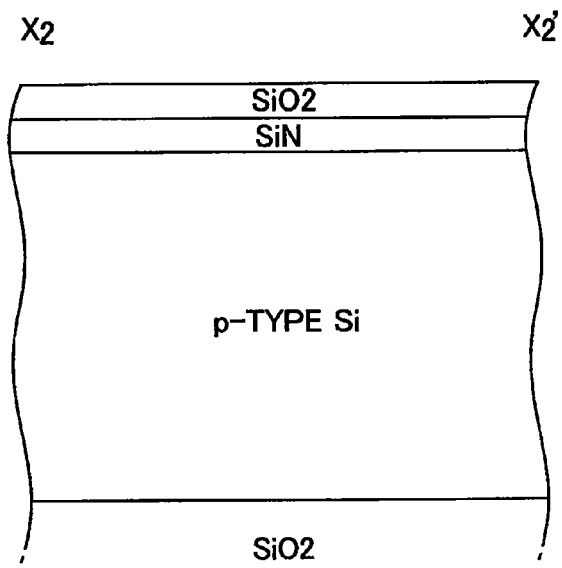
(b)
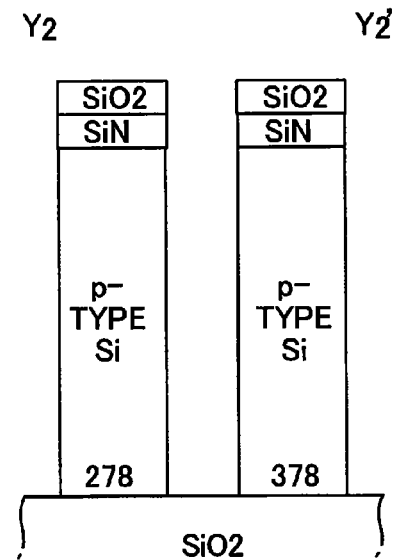
FIG.17
(a)
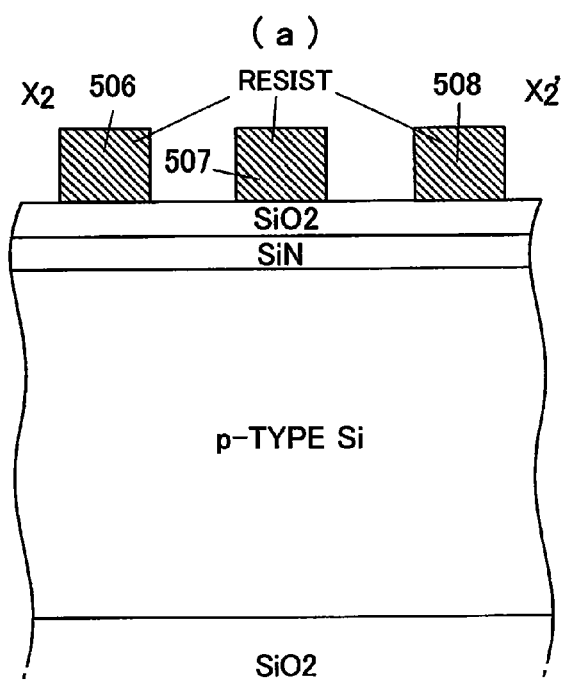
(b)
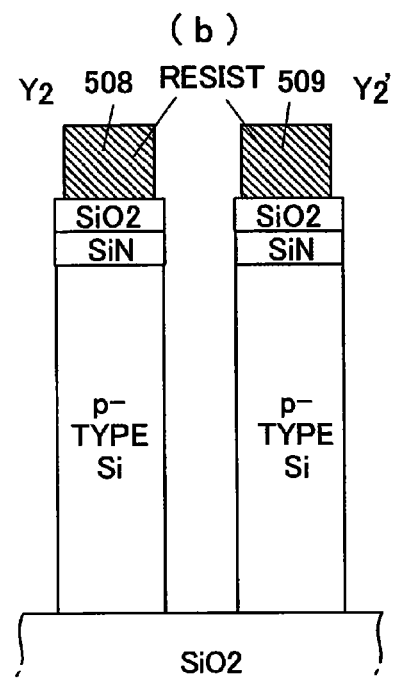

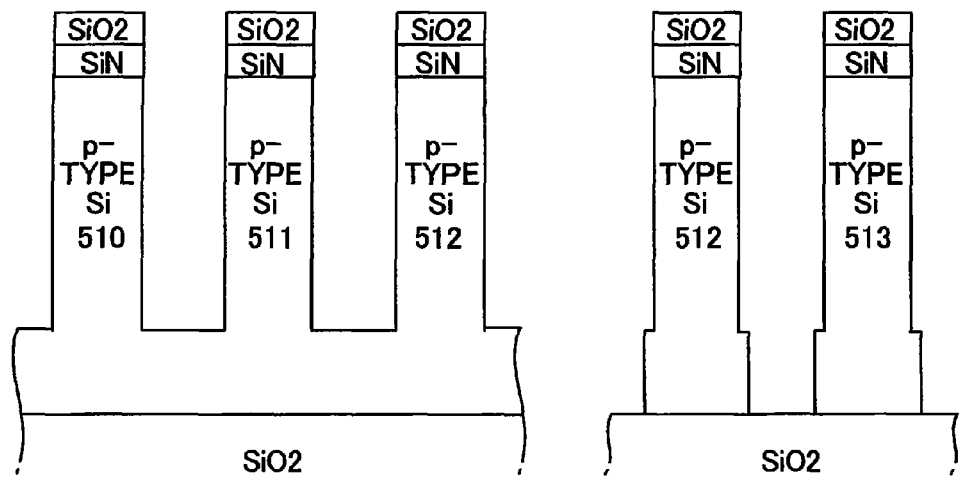
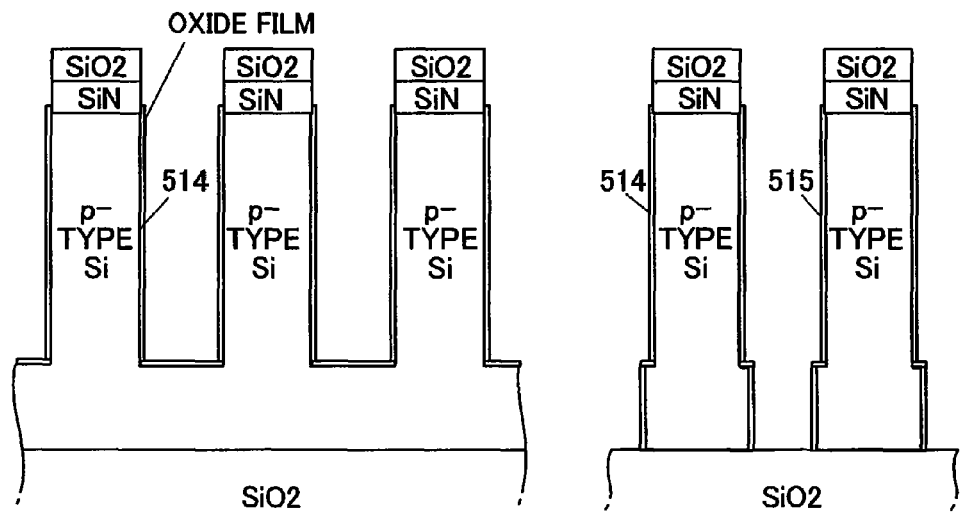

FIG.28
(a) 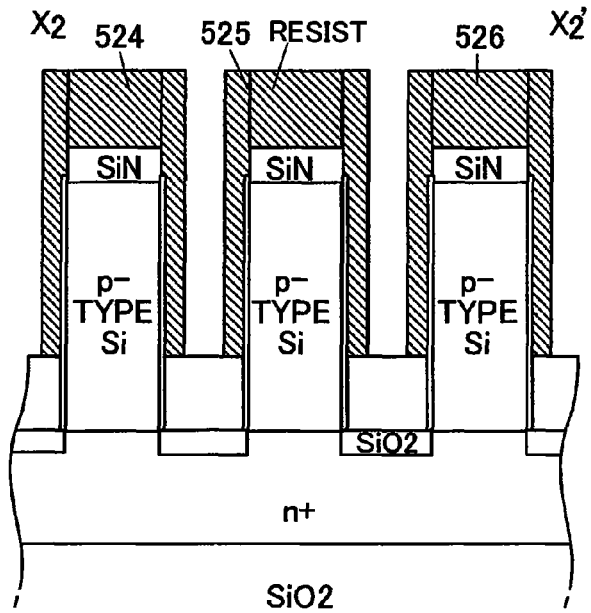
(b) 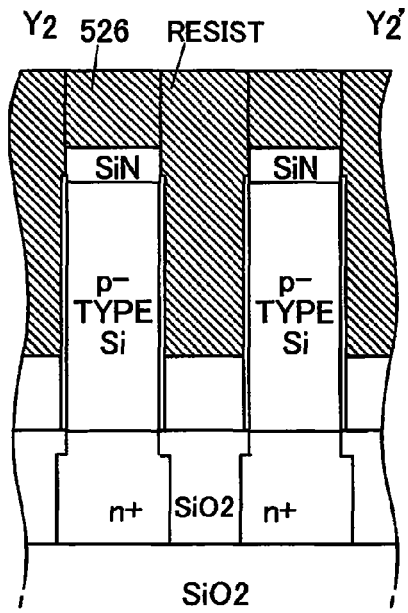
FIG.29
(a) 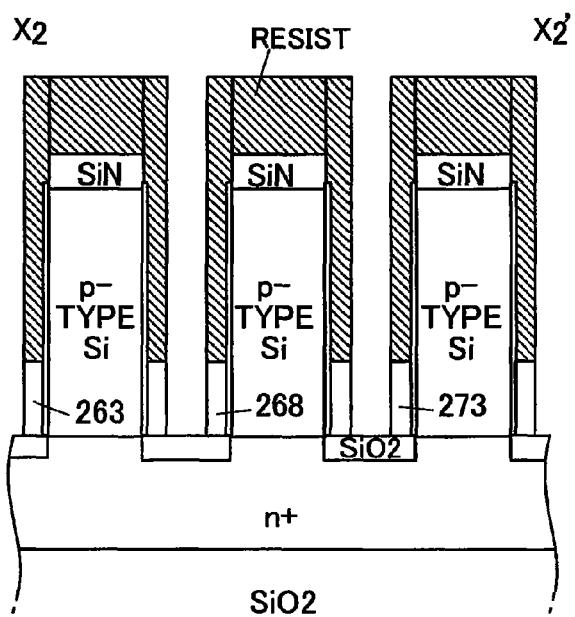
(b) 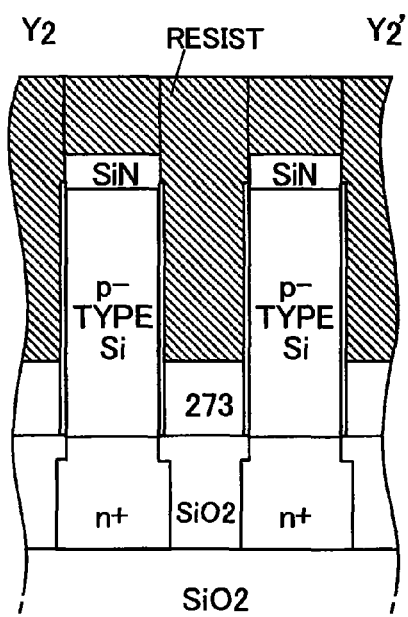

FIG.30
(a) 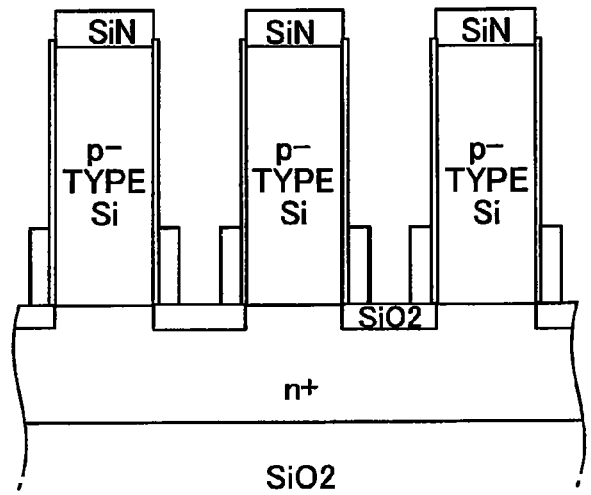
(b) 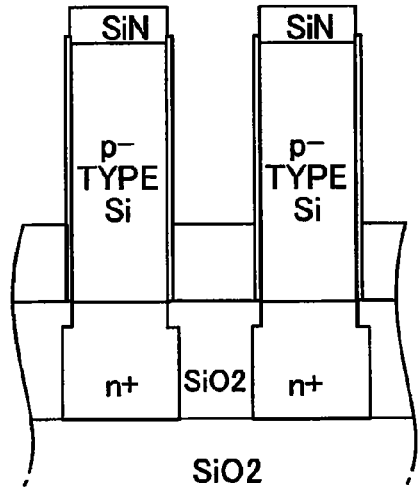
FIG.31
(a) 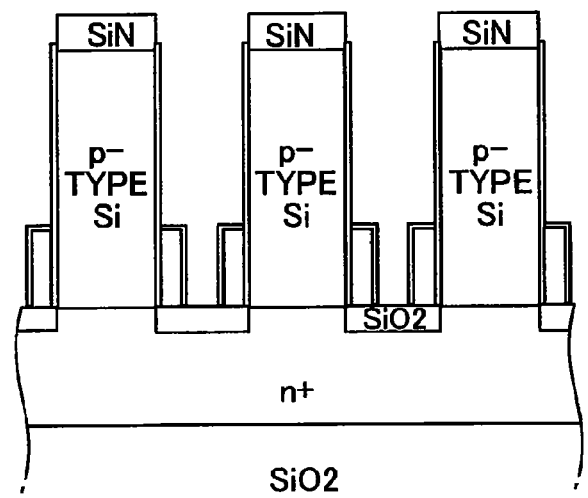
(b) 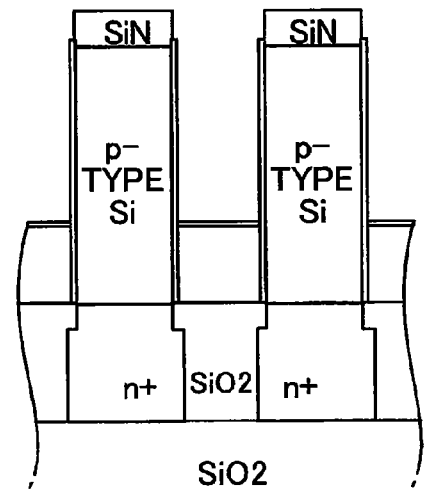

FIG.32
(a)
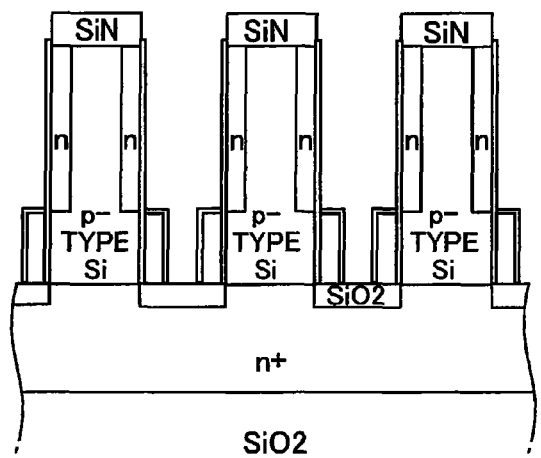
(b)
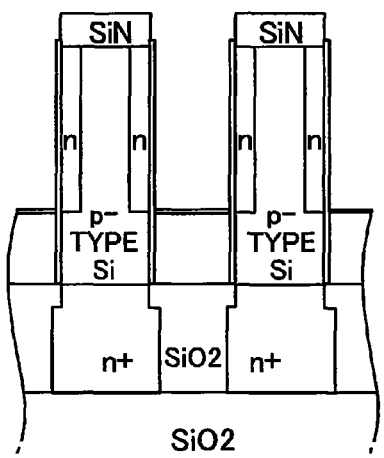
FIG.33
(a)
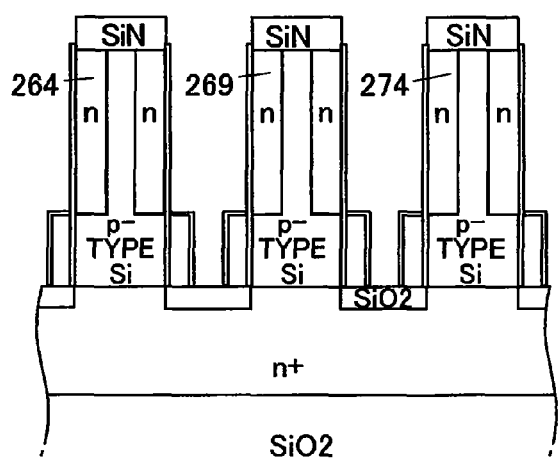
(b)
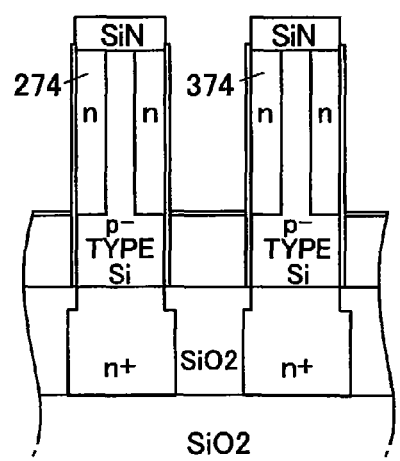

(a)            (b)

(a)            (b)

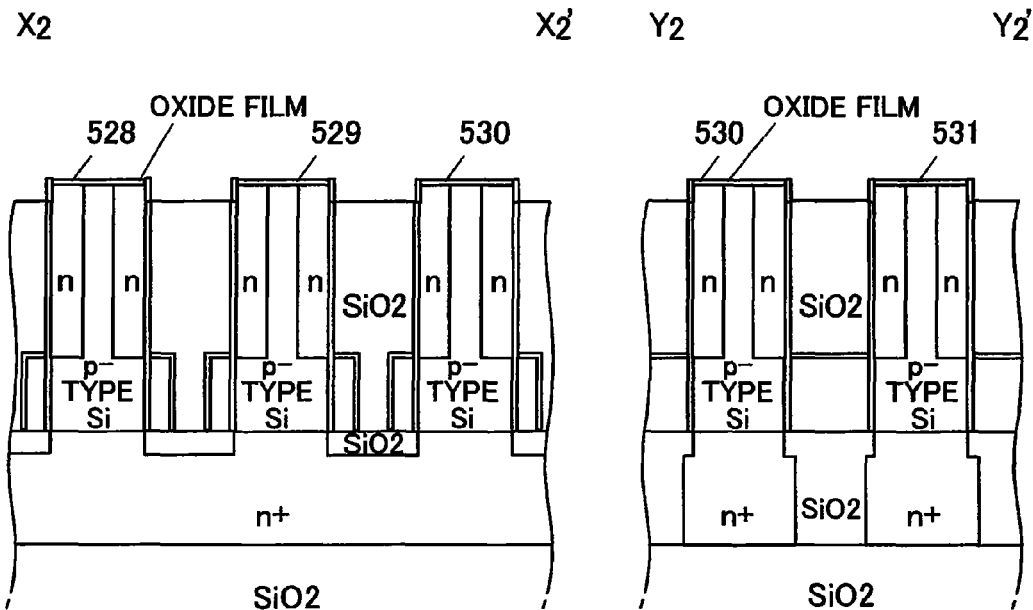
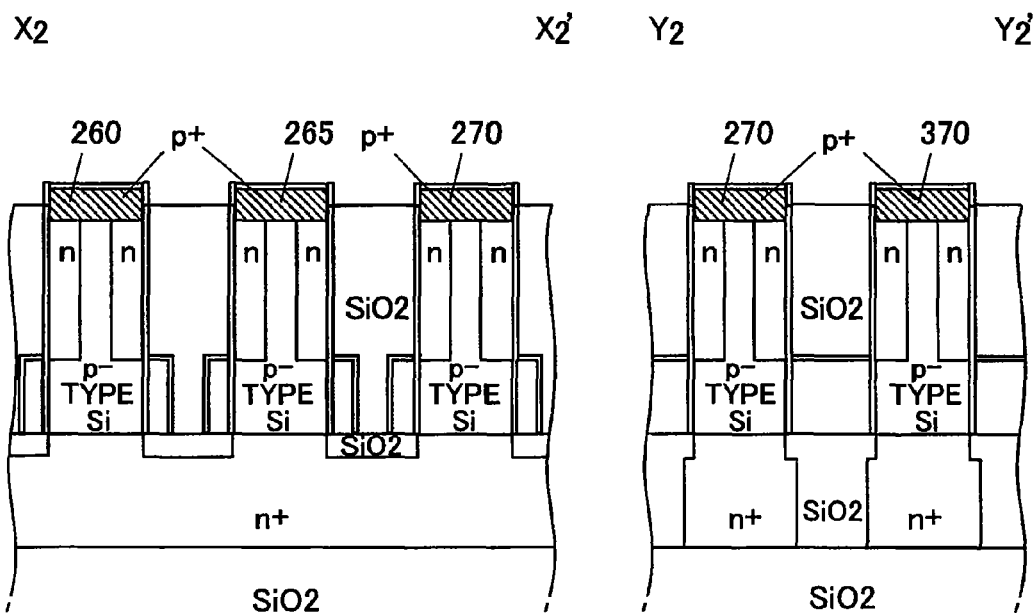

FIG.38
(a) 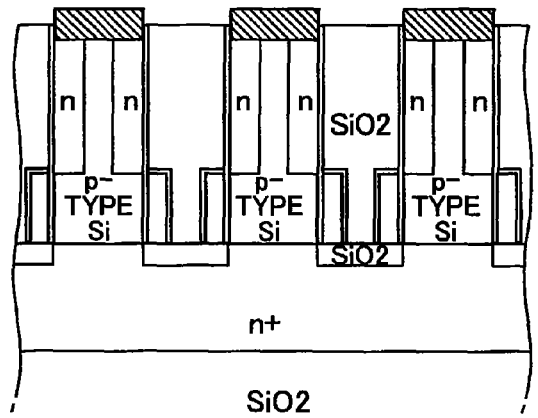
(b) 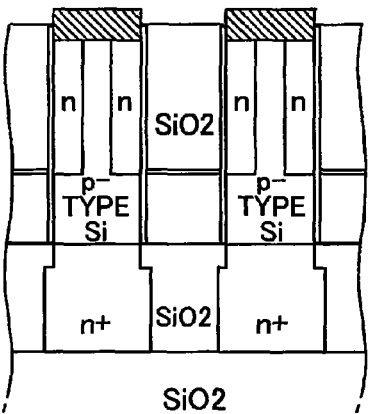
FIG.39
(a) 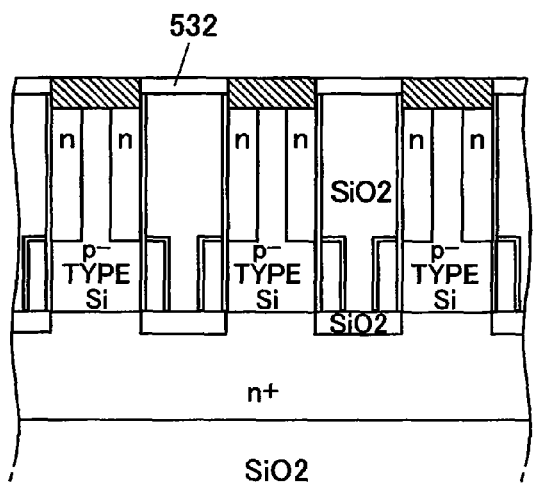
(b) 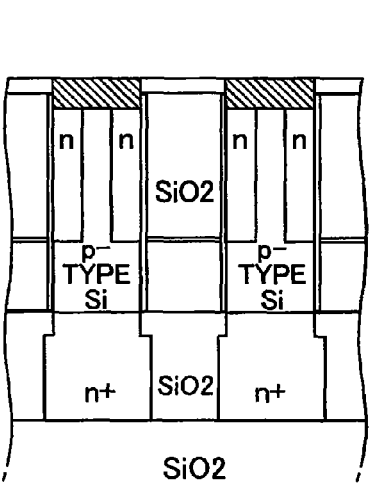

FIG.42
(a)
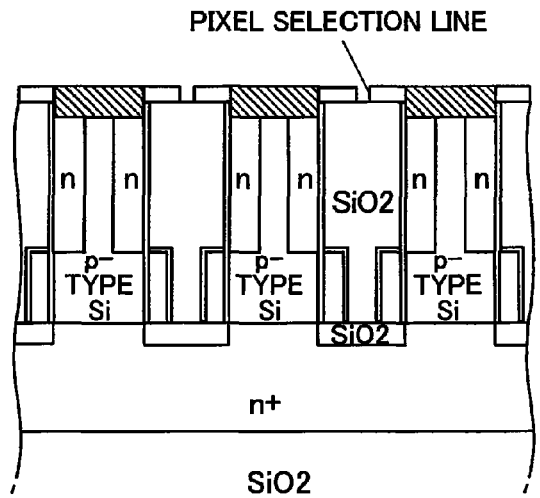
(b)
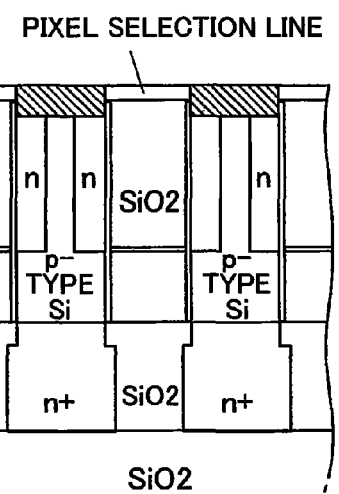
FIG.43
(a)
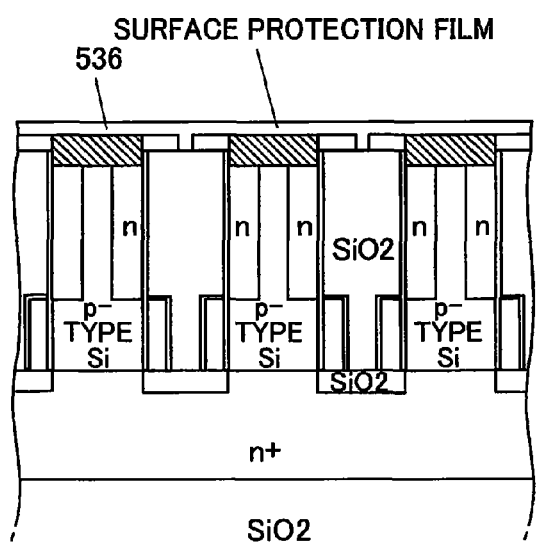
(b)
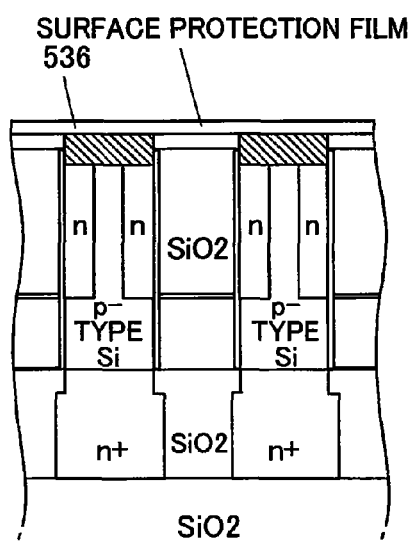

FIG.45
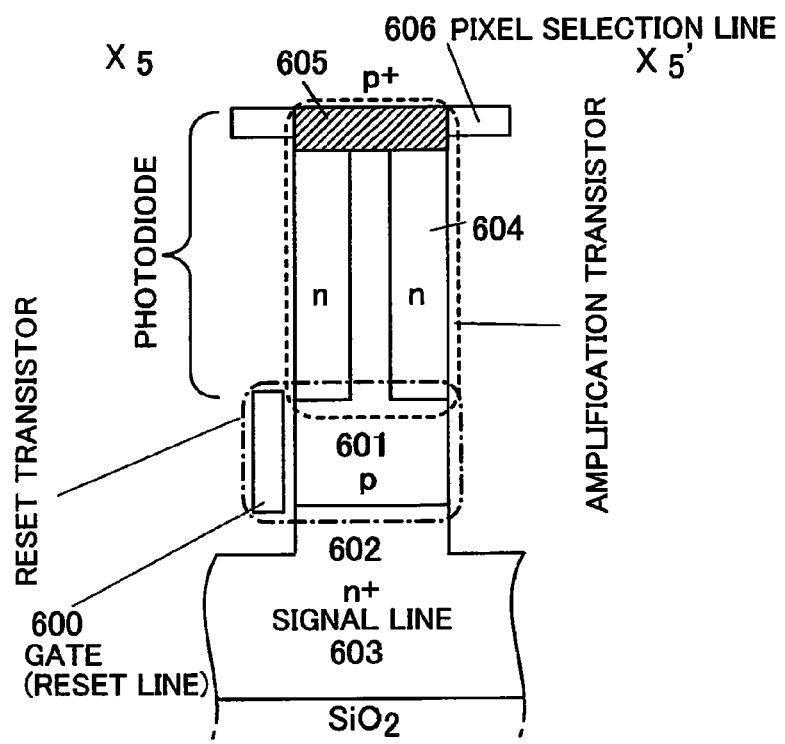
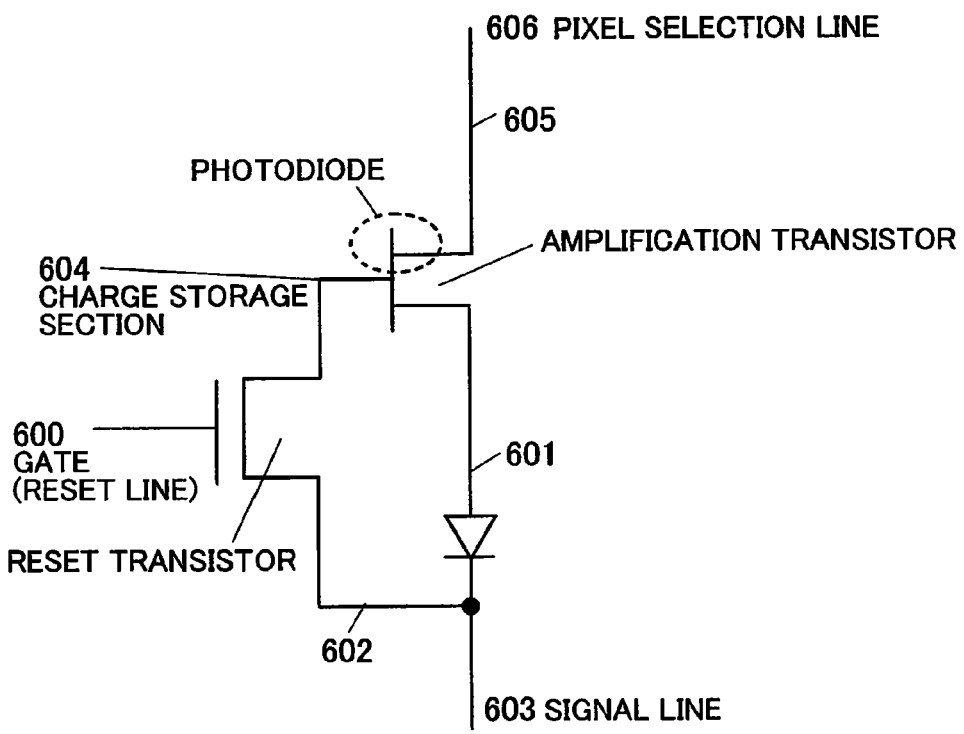

SOLID-STATE IMAGING DEVICE

RELATED APPLICATIONS

Pursuant to 35 U.S.C. §119(e), this application claims the benefit of the filing date of Provisional U.S. Patent Application Ser. No. 61/207,625 filed on Feb. 13, 2009. Pursuant to 35 U.S.C. §365(a), this application is a continuation application of PCT/JP2007/067732 filed on Sep. 12, 2007. The entire contents of these applications are hereby incorporated by reference.

BACKGROUND OF THE INVENTION

1. Field of the Invention

The present invention relates to a solid-state imaging device.

2. Description of the Related Art

There has been proposed an amplification type solid-state imaging device configured to have an amplification function on a pixel-by-pixel basis and perform a readout operation using a scanning circuit, i.e., a CMOS image sensor. The CMOS image sensor has a photoelectric conversion section, an amplification section, a pixel selection section and a reset section which are formed in one pixel, using three MOS transistors in addition to a photodiode making up the photoelectric conversion section (see, for example, the Patent Publication 1). The CMOS image sensor is operable to store electric charges generated by the photoelectric conversion section made up of a photodiode, and, after amplifying the stored electric charges through the amplification section, read out the amplified electric charges using the pixel selection section.

FIG. 1 shows a unit pixel of a conventional CMOS image sensor. In FIG. 1, the reference numeral 5 indicates a photoelectric-conversion photodiode. The reference numerals 101, 102 and 103 indicate an amplification transistor, a reset transistor and a selection transistor, respectively. The reference numerals 13, 11, 12 14 and 114 indicate a signal line, a pixel-selection clock line, a reset clock line, a power supply line, and a reset power supply line, respectively. The unit pixel of the conventional CMOS image sensor has the photodiode and the three MOS transistors in a plane. This means that it is difficult to achieve a high degree of pixel integration.

Patent Document 1: JP 2000-244818A

SUMMARY OF THE INVENTION

It is therefore an object of the present invention to provide a CMOS image sensor with a high degree of pixel integration.

In accordance with a first aspect of the present invention, there is provided a solid-state imaging device which comprises: a signal line formed on a Si substrate; an island-shaped semiconductor formed on the signal line; and a pixel selection line, wherein the island-shaped semiconductor includes: a first semiconductor layer formed as a bottom portion of the island-shaped semiconductor and connected to the signal line; a second semiconductor layer formed above and adjacent to the first semiconductor layer; a gate connected to the second semiconductor layer through an insulating film; a charge storage section comprised of a third semiconductor layer connected to the second semiconductor layer and adapted, in response to receiving light, to undergo a change in amount of electric charges therein; and a fourth semiconductor layer formed above and adjacent to the second and third semiconductor layers, and wherein the pixel selection line is connected to the fourth semiconductor layer formed as a top portion of the island-shaped semiconductor.

In one preferred embodiment of the present invention, the signal line is an n+-type diffusion layer; the first semiconductor layer is an n+-type diffusion layer; the second semiconductor layer is a p-type impurity-doped region; the third semiconductor layer is an n-type diffusion layer; and the fourth semiconductor layer is a p+-type diffusion layer.

More preferably, a combination of the p+-type diffusion layer and the n-type diffusion layer functions as a photoelectric-conversion photodiode; a combination of the p+-type diffusion layer, the n-type diffusion layer and the p-type impurity-doped region functions as an amplification transistor; and a combination of the n+-type diffusion layer of the first semiconductor layer, the p-type impurity-doped region, the n-type diffusion layer and the gate functions as a reset transistor.

In another preferred embodiment of the present invention, the second semiconductor layer has a first portion formed in a cross-sectionally-circular pillar shape, wherein the gate is formed to surround an outer periphery of the first pillar-shaped portion of the second semiconductor layer through the insulating film.

The second semiconductor layer has a second portion formed in a cross-sectionally-circular pillar shape, wherein the third semiconductor layer is formed to surround an outer periphery of the second pillar-shaped portion of the second semiconductor layer.

In accordance with a second aspect of the present invention, there is provided a solid-state imaging device array comprising a plurality of the above solid-state imaging devices which are arranged on the substrate in an n-row by m-column array, wherein each of n and m is an integer of 1 or more.

In accordance with a third aspect of the present invention, there is provided a method of driving the above solid-state imaging device, which comprises the step of applying a first drive voltage to the pixel selection line, applying a second drive voltage to the signal line and applying a third drive voltage to the gate, to reset the charge storage section.

The method may further comprise the step of receiving light, while applying the first drive voltage to respective ones of the pixel selection line, the gate and the signal line, to change an amount of electric charges stored in the charge storage section.

The method may further comprise the step of applying the second drive voltage to the pixel selection line, applying the first drive voltage to the gate and applying the first drive voltage to the signal line, to produce a flow of readout current while amplifying the electric charges stored in the charge storage section and, so as to perform a readout operation.

Preferably, in the method of the present invention, the first drive voltage, the second drive voltage and the third drive voltage are set at zero V, 1V, and 1.5V, respectively.

As stated above, the present invention provides a solid-state imaging device which comprises: a signal line formed on a Si substrate; an island-shaped semiconductor formed on the signal line; and a pixel selection line, wherein the island-shaped semiconductor includes: a first semiconductor layer formed as a bottom portion of the island-shaped semiconductor and connected to the signal line; a second semiconductor layer formed above and adjacent to the first semiconductor layer; a gate connected to the second semiconductor layer through an insulating film; a charge storage section comprised of a third semiconductor layer connected to the second semiconductor layer and adapted, in response to receiving light, to undergo a change in amount of electric charges therein; and a fourth semiconductor layer formed above and adjacent to the second and third semiconductor layers, and wherein the pixel selection line is connected to the fourth semiconductor layer formed as a top portion of the island-shaped semiconductor.

In the solid-state imaging device, a combination of the third and fourth semiconductor layers functions as a photo-electric-conversion photodiode, and a combination of the second, third and fourth semiconductors and a combination of the first, second and third semiconductor layers and the gate function as an amplification transistor and a reset transistor, respectively.

This makes it possible to form a unit pixel of a CMOS image sensor in an area of $4F^2$ (F: minimum fabrication size) to achieve a CMOS image sensor with a high degree of pixel integration.

BRIEF DESCRIPTION OF THE DRAWINGS

FIG. 3(a) is a sectional view taken along the line $X_1$-$X'_1$ in FIG. 2.

FIG. 3(b) is a schematic diagram showing an equivalent circuit of the cross-sectional structure in FIG. 3(a).

FIG. 4(a) is a sectional view taken along the line $Y_1$-$Y'_1$ in FIG. 2.

FIG. 4(b) is a schematic diagram showing an equivalent circuit of the cross-sectional structure in FIG. 4(a).

FIG. 9 is a sectional view taken along the line $Y_2$-$Y'_2$ in FIG. 6.

FIG. 10 is a schematic diagram showing an equivalent circuit of a solid-state imaging device according to the present invention.

FIGS. 13(a) and 13(b) are explanatory diagrams showing the method of driving the solid-state imaging device according to the present invention.

FIGS. 16(a) and 16(b) are, respectively, a sectional view ($X_2$-$X'_2$ section) and a sectional view ($Y_2$-$Y'_2$ section) showing a step in the example of the production method.

FIGS. 17(a) and 17(b) are, respectively, a sectional view ($X_2$-$X'_2$ section) and a sectional view ($Y_2$-$Y'_2$ section) showing a step in the example of the production method.

FIGS. 20(a) and 20(b) are, respectively, a sectional view ($X_2$-$X'_2$ section) and a sectional view ($Y_2$-$Y'_2$ section) showing a step in the example of the production method.

FIGS. 21(a) and 21(b) are, respectively, a sectional view ($X_2$-$X'_2$ section) and a sectional view ($Y_2$-$Y'_2$ section) showing a step in the example of the production method.

FIGS. 28(a) and 28(b) are, respectively, a sectional view ($X_2$-$X'_2$ section) and a sectional view ($Y_2$-$Y'_2$ section) showing a step in the example of the production method.

FIGS. 29(a) and 29(b) are, respectively, a sectional view ($X_2$-$X'_2$ section) and a sectional view ($Y_2$-$Y'_2$ section) showing a step in the example of the production method.

FIGS. 30(a) and 30(b) are, respectively, a sectional view ($X_2$-$X'_2$ section) and a sectional view ($Y_2$-$Y'_2$ section) showing a step in the example of the production method.

FIGS. 31(a) and 31(b) are, respectively, a sectional view ($X_2$-$X'_2$ section) and a sectional view ($Y_2$-$Y'_2$ section) showing a step in the example of the production method.

FIGS. 32(a) and 32(b) are, respectively, a sectional view ($X_2$-$X'_2$ section) and a sectional view ($Y_2$-$Y'_2$ section) showing a step in the example of the production method.

FIGS. 33(a) and 33(b) are, respectively, a sectional view ($X_2$-$X'_2$ section) and a sectional view ($Y_2$-$Y'_2$ section) showing a step in the example of the production method.

FIGS. 36(a) and 36(b) are, respectively, a sectional view ($X_2$-$X'_2$ section) and a sectional view ($Y_2$-$Y'_2$ section) showing a step in the example of the production method.

FIGS. 37(a) and 37(b) are, respectively, a sectional view ($X_2$-$X'_2$2 section) and a sectional view ($Y_2$-$Y'_2$ section) showing a step in the example of the production method.

FIGS. 38(a) and 38(b) are, respectively, a sectional view ($X_2$-$X'_2$ section) and a sectional view ($Y_2$-$Y'_2$ section) showing a step in the example of the production method.

FIGS. 39(a) and 39(b) are, respectively, a sectional view ($X_2$-$X'_2$ section) and a sectional view ($Y_2$-$Y'_2$ section) showing a step in the example of the production method.

FIGS. 42(a) and 42(b) are, respectively, a sectional view ($X_2$-$X'_2$ section) and a sectional view ($Y_2$-$Y'_2$ section) showing a step in the example of the production method.

FIGS. 43(a) and 43(b) are, respectively, a sectional view ($X_2$-$X'_2$ section) and a sectional view ($Y_2$-$Y'_2$ section) showing a step in the example of the production method.

FIG. 45(a) is a sectional view taken along the line $X_5$-$X'_5$ in FIG. 44.

FIG. 45(b) is a schematic diagram showing an equivalent circuit of the cross-sectional structure in FIG. 45(a).

DETAILED DESCRIPTION OF THE PREFERRED EMBODIMENTS

Figure 1:
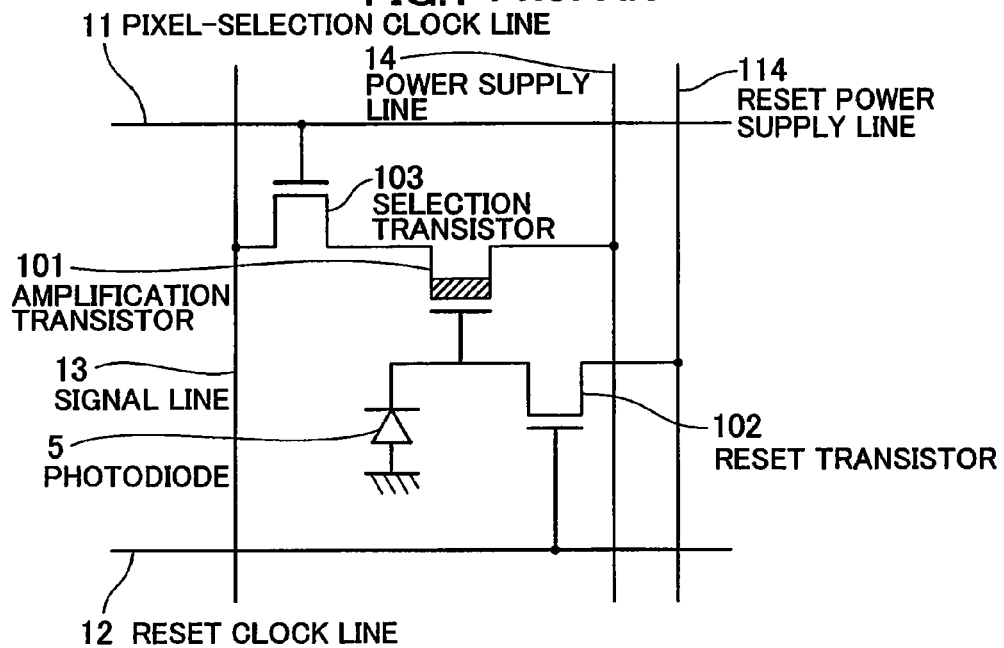
FIG. 1 is a schematic diagram showing an equivalent circuit of a unit pixel of a conventional CMOS image sensor.

The present invention will now be described based on an embodiment illustrated in the drawings. However, it should be understood that the present invention is not limited to the following embodiment.

Figure 2:
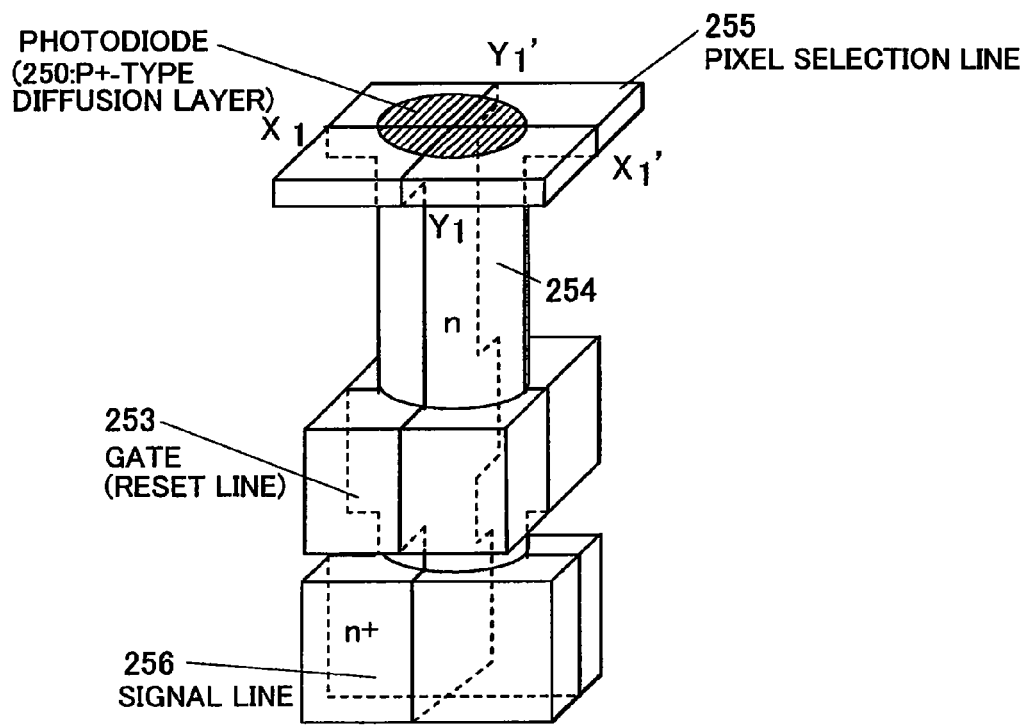
FIG. 2 is a perspective view showing one solid-state imaging device according to a first embodiment of the present invention.

FIG. 2 is a perspective view showing one solid-state imaging device according to a first embodiment of the present invention. FIG. 3(a) is a sectional view taken along the line $X_1$-$X'_1$ in FIG. 2, and FIG. 3(b) is a schematic diagram showing an equivalent circuit of the cross-sectional structure in FIG. 3(a). FIG. 4(a) is a sectional view taken along the line $Y_1$-$Y'_1$ in FIG. 2, and FIG. 4(b) is a schematic diagram showing an equivalent circuit of the cross-sectional structure in FIG. 4(a).

An island-shaped semiconductor is formed on a Si substrate. An n+-type diffusion layer is formed underneath the island-shaped semiconductor and in contact with the Si substrate to serve as a signal line 256. An n+-type diffusion layer 252 is formed on the signal line 256, and a p-type impurity-doped region 251 is formed on the n+-type diffusion layer 252. A gate 253 is connected to the p-type impurity-doped region 251 through an insulating film. The gate 253 is formed such that a lower end thereof is located adjacent to an upper end of the n+-type diffusion layer 252.

The p-type impurity-doped region 251 has a first portion to which the gate 253 is connected, and a second portion located above the first portion. A charge storage section is comprised of an n-type diffusion layer 254 connected to the second portion of the p-type impurity-doped region 251 and adapted, in response to receiving light, to undergo a change in amount of electric charges therein. The gate 253 is formed such that an upper end thereof is located adjacent to a lower end of the n-type diffusion layer 254.

A p+-type diffusion layer 250 is formed in connected relation to the p-type impurity-doped region 251 and the n-type diffusion layer 254. The island-shaped semiconductor includes the n+-type diffusion layer 252, the p-type impurity-doped region 251, the gate 253, the n-type diffusion layer 254, and the p+-type diffusion layer 250.

A pixel selection line 255 is formed in connected relation to the p+-type diffusion layer 250 formed as a top portion of the island-shaped semiconductor.

A combination of the p+-type diffusion layer 250 and the n-type diffusion layer 254 functions as a photoelectric-conversion photodiode. A combination of the p+-type diffusion layer 250, the n-type diffusion layer 254 and the p-type impurity-doped region 251 functions as an amplification transistor. A combination of the n+-type diffusion layer 252, the p-type impurity-doped region 251, the n-type diffusion layer 254 and the gate 253 functions as a reset transistor.

Figure 5:
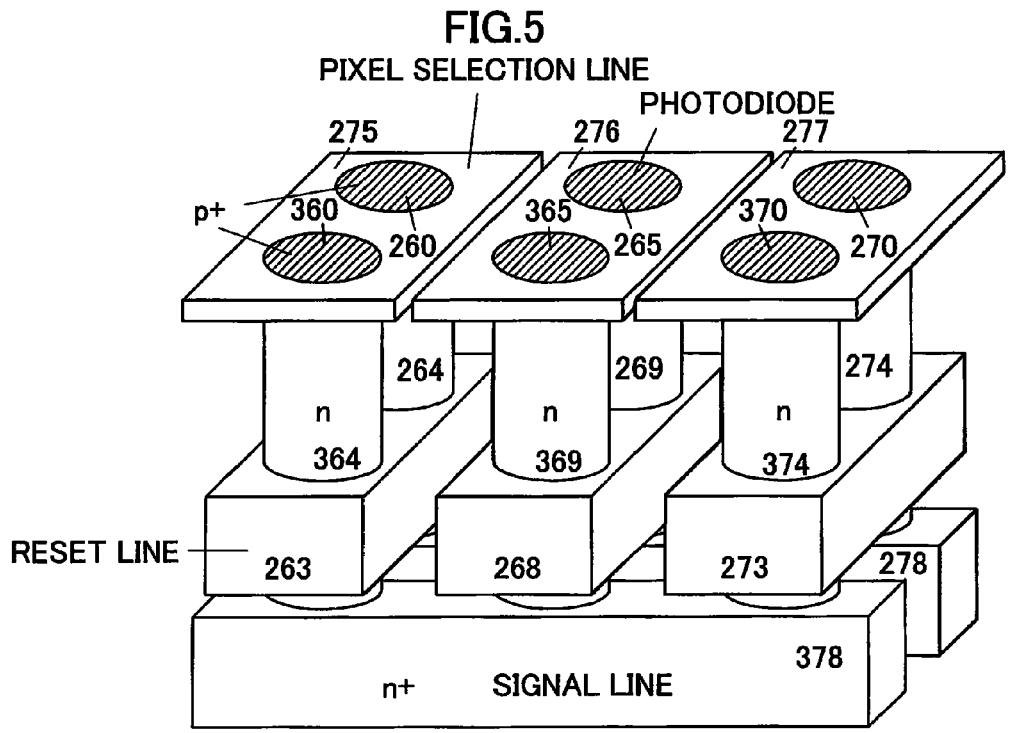
FIG. 5 is a perspective view showing a solid-state imaging device array in which six sets of the solid-state imaging devices according to the first embodiment are arranged in a two-row by three-column array.
Figure 6:
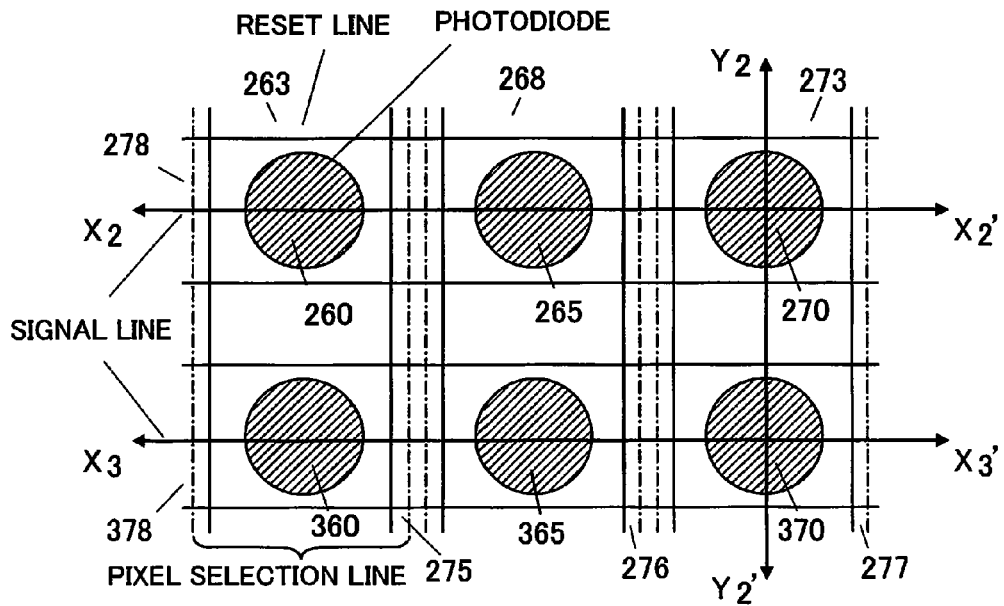
FIG. 6 is a top plan view of the solid-state imaging device array.
Figure 7:
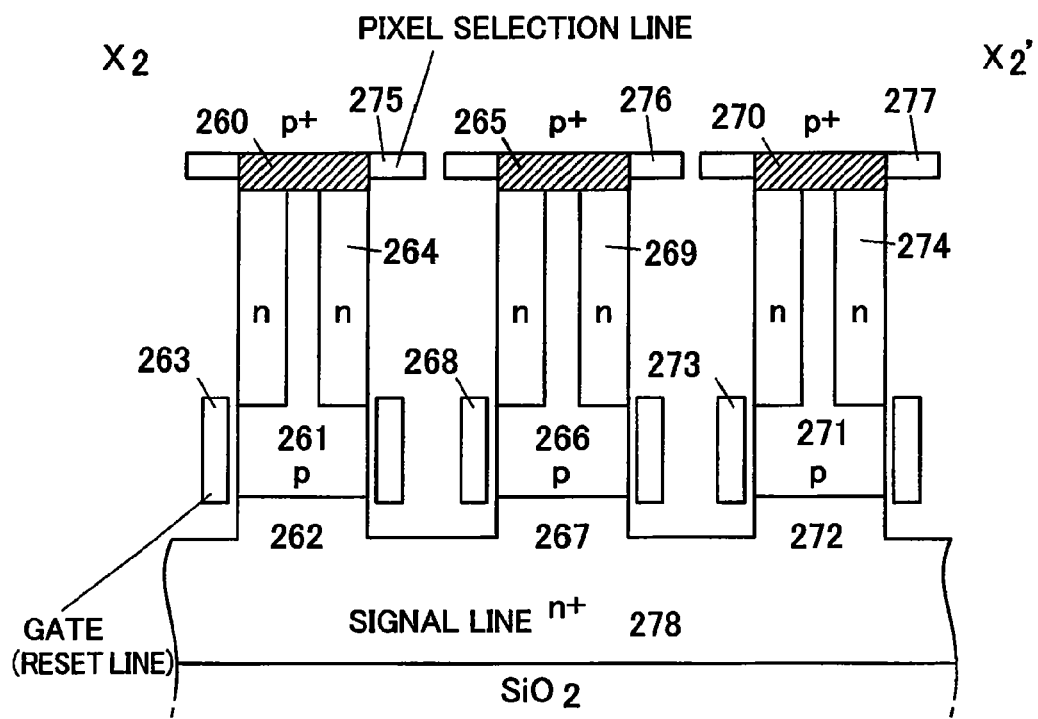
FIG. 7 is a sectional view taken along the line $X_2$-$X'_2$ in FIG. 6.
Figure 8:
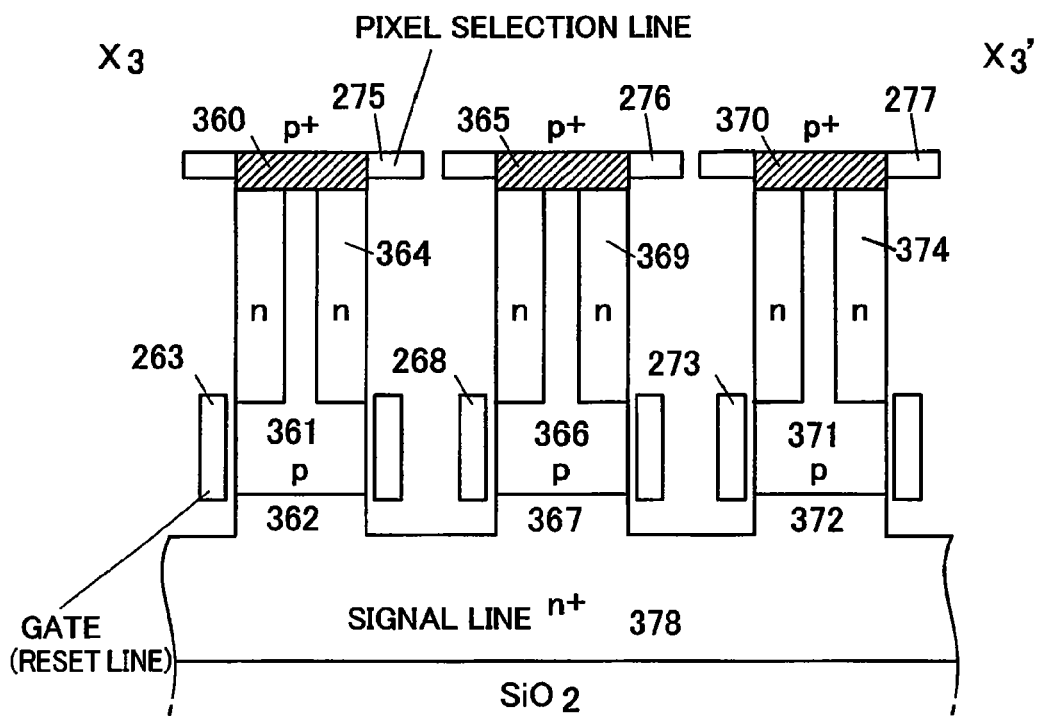
FIG. 8 is a sectional view taken along the line $X_3$-$X'_3$ in FIG. 6.
Figure 11:
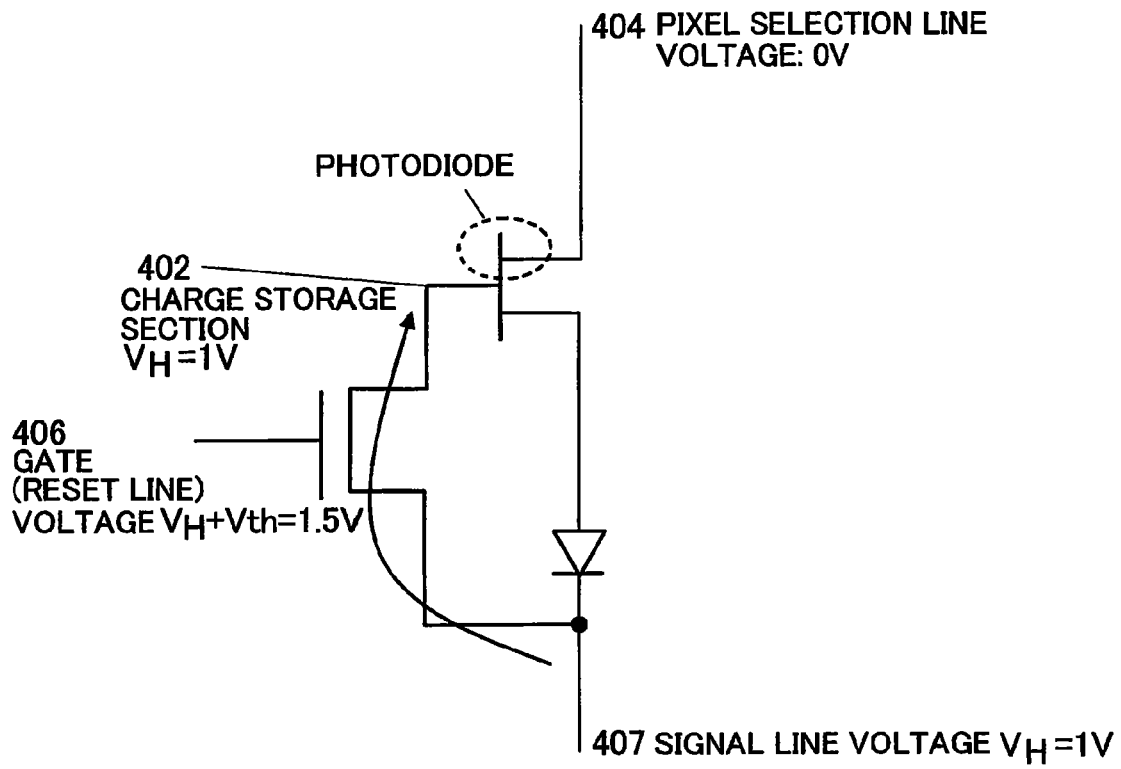
FIG. 11 is an explanatory diagram showing a method of driving the solid-state imaging device according to the present invention.

FIG. 5 is a perspective view showing a solid-state imaging device array having six sets of the above solid-state imaging devices which are arranged in a two-row by three-column array. FIG. 6 is a top plan view of the solid-state imaging device array. FIG. 7, FIG. 8 and FIG. 9 are a sectional view taken along the line $X_2$-$X'_2$ in FIG. 6, a sectional view taken along the line $X_3$-$X'_3$ in FIG. 6, and a sectional view taken along the line $Y_2$-$Y'_2$ in FIG. 6, respectively.

A solid-state imaging device at an intersection of the 1st row and the 1st column (1st-row/1st-column solid-state imaging device) comprises: an island-shaped semiconductor formed on a Si substrate; a p+-type diffusion layer 260, a p-type impurity-doped region 261 and an n+-type diffusion layer 262 each formed in the island-shaped semiconductor; a charge storage section 264 comprised of an n-type diffusion layer connected to the p-type impurity-doped region 261 and adapted, in response to receiving light, to undergo a change in amount of electric charges therein; a gate 263 connected to the p-type impurity-doped region 261 through an insulating film; and a pixel selection line 275 connected to the p+-type diffusion layer 260 formed as a top portion of the island-shaped semiconductor.

A solid-state imaging device at an intersection of the 1st row and the 2nd column (1st-row/2nd-column solid-state imaging device) comprises: an island-shaped semiconductor formed on the Si substrate; a p+-type diffusion layer 265, a p-type impurity-doped region 266 and an n+-type diffusion layer 267 each formed in the island-shaped semiconductor; a charge storage section 269 comprised of an n-type diffusion layer connected to the p-type impurity-doped region 266 and adapted, in response to receiving light, to undergo a change in amount of electric charges therein; a gate 268 connected to the p-type impurity-doped region 266 through an insulating film; and a pixel selection line 276 connected to the p+-type diffusion layer 265 formed as a top portion of the island-shaped semiconductor.

A solid-state imaging device at an intersection of the 1st row and the 3rd column (1st-row/3rd-column solid-state imaging device) comprises: an island-shaped semiconductor formed on the Si substrate; a p+-type diffusion layer 270, a p-type impurity-doped region 271 and an n+-type diffusion layer 272 each formed in the island-shaped semiconductor; a charge storage section 274 comprised of an n-type diffusion layer connected to the p-type impurity-doped region 271 and adapted, in response to receiving light, to undergo a change in amount of electric charges therein; a gate 273 connected to the p-type impurity-doped region 271 through an insulating film; and a pixel selection line 277 connected to the p+-type diffusion layer 270 formed as a top portion of the island-shaped semiconductor.

A solid-state imaging device at an intersection of the 2nd row and the 1st column (2nd-row/1st-column solid-state imaging device) comprises: an island-shaped semiconductor formed on the Si substrate; a p+-type diffusion layer 360, a p-type impurity-doped region 361 and an n+-type diffusion layer 362 each formed in the island-shaped semiconductor; a charge storage section 364 comprised of an n-type diffusion layer connected to the p-type impurity-doped region 361 and adapted, in response to receiving light, to undergo a change in amount of electric charges therein; the gate 263 connected to the p-type impurity-doped region 361 through an insulating film; and the pixel selection line 275 connected to the p+-type diffusion layer 361 formed as a top portion of the island-shaped semiconductor.

A solid-state imaging device at an intersection of the 2nd row and the 2nd column (2nd-row/2nd-column solid-state imaging device) comprises: an island-shaped semiconductor formed on the Si substrate; a p+-type diffusion layer 365, a p-type impurity-doped region 366 and an n+-type diffusion layer 367 each formed in the island-shaped semiconductor; a charge storage section 369 comprised of an n-type diffusion layer connected to the p-type impurity-doped region 366 and adapted, in response to receiving light, to undergo a change in amount of electric charges therein; the gate 268 connected to the p-type impurity-doped region 366 through an insulating film; and the pixel selection line 276 connected to the p+-type diffusion layer 365 formed as a top portion of the island-shaped semiconductor.

A solid-state imaging device at an intersection of the 2nd row and the 3rd column (2nd-row/3rd-column solid-state imaging device) comprises: an island-shaped semiconductor formed on the Si substrate; a p+-type diffusion layer 370, a p-type impurity-doped region 371 and an n+-type diffusion layer 372 each formed in the island-shaped semiconductor; a charge storage section 374 comprised of an n-type diffusion layer connected to the p-type impurity-doped region 371 and adapted, in response to receiving light, to undergo a change in amount of electric charges therein; the gate 273 connected to the p-type impurity-doped region 371 through an insulating film; and the pixel selection line 277 connected to the p+-type diffusion layer 370 formed as a top portion of the island-shaped semiconductor.

The pixel selection line 275 is formed to interconnect the p+-type diffusion layer 260 as the top portion of the island-shaped semiconductor in the 1st-row/1st-column solid-state imaging device, and the p+-type diffusion layer 360 as the top portion of the island-shaped semiconductor in the 2nd-row/1st-column solid-state imaging device. The pixel selection line 276 is formed to interconnect the p+-type diffusion layer 265 as the top portion of the island-shaped semiconductor in the 1st-row/2nd-column solid-state imaging device, and the p+-type diffusion layer 365 as the top portion of the island-shaped semiconductor in the 2nd-row/2nd-column solid-state imaging device. The pixel selection line 277 is formed to interconnect the p+-type diffusion layer 270 as the top portion of the island-shaped semiconductor in the 1st-row/3rd-column solid-state imaging device, and the p+-type diffusion layer 370 as the top portion of the island-shaped semiconductor in the 2nd-row/3rd-column solid-state imaging device.

Further, a signal line 278 is formed to interconnect the n+-type diffusion layer 262 as a bottom portion of the island-shaped semiconductor in the 1st-row/1st-column solid-state imaging device, the n+-type diffusion layer 267 as a bottom portion of the island-shaped semiconductor in the 1st-row/2nd-column solid-state imaging device, and the n+-type diffusion layer 272 as a bottom portion of the island-shaped semiconductor in the 1st-row/3rd-column solid-state imaging device, and a signal line 378 is formed to interconnect the n+-type diffusion layer 362 as a bottom portion of the island-shaped semiconductor in the 2nd-row/1st-column solid-state imaging device, the n+-type diffusion layer 367 as a bottom portion of the island-shaped semiconductor in the 2nd-row/2nd-column solid-state imaging device, and the n+-type diffusion layer 372 as a bottom portion of the island-shaped semiconductor in the 2nd-row/3rd-column solid-state imaging device.

FIG. 10 shows an equivalent circuit of a solid-state imaging device according to the present invention. The solid-state imaging device according to the present invention comprises, a photodiode 401 comprised of the gate and source of an amplification transistor, a charge storage section 402 comprised of the gate of the amplification transistor, an amplification transistor 403 comprised of a junction transistor which amplifies the charge of the charge storage section, a pixel selection line 404 connected to the source of the junction transistor, a reset transistor 405, the source of which is connected to the gate of the amplification transistor, and comprised of a MOS transistor which resets the charge storage section, a gate (reset line) 406, a diode, the anode of which is connected to the drain of the amplification transistor and the cathode of which is connected to the drain of the reset transistor, and a signal line 407 connected to the cathode of the diode.

FIGS. 11, 12, 13(a) and 13(b) show a method of driving the solid-state imaging device according to the present invention.

Firstly, 0V, $V_H$ (e.g., 1V), and $V_H$+Vth, are applied to the pixel selection line 404, the signal line 407, and the gate (reset line) 406, respectively, to allow the charge storage section 402 to be set at $V_H$ so as to perform an operation of resetting the charge storage section 402 (FIG. 11), wherein Vth is a threshold voltage of the reset transistor, and set, for example, at 0.5V.

Figure 12:
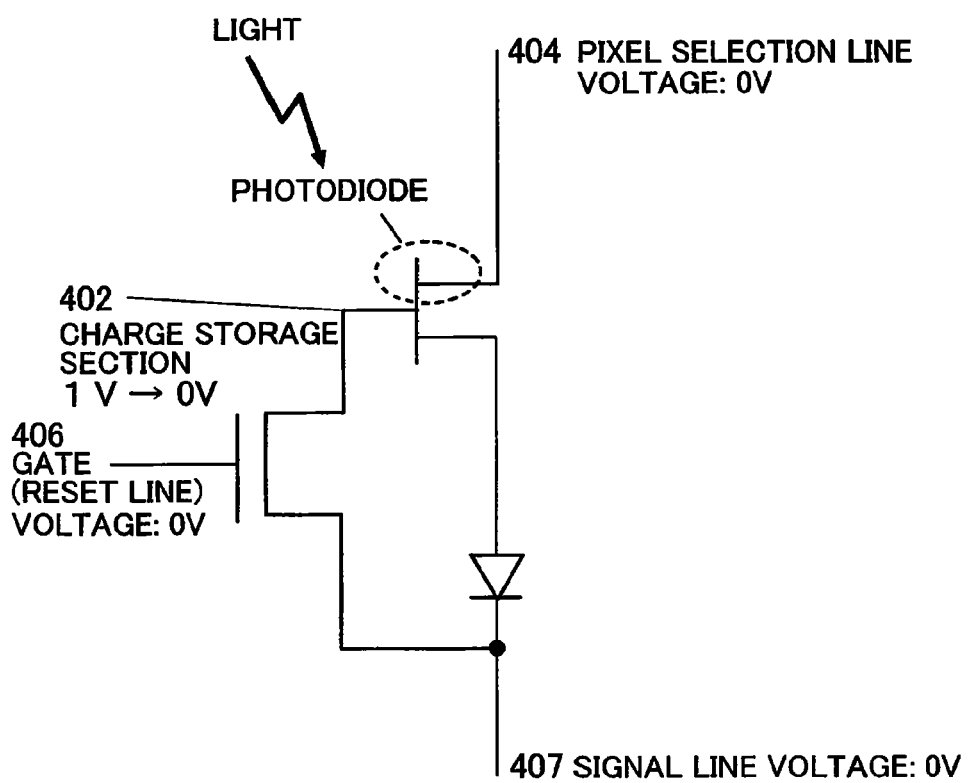
FIG. 12 is an explanatory diagram showing the method of driving the solid-state imaging device according to the present invention.
Figure 14:
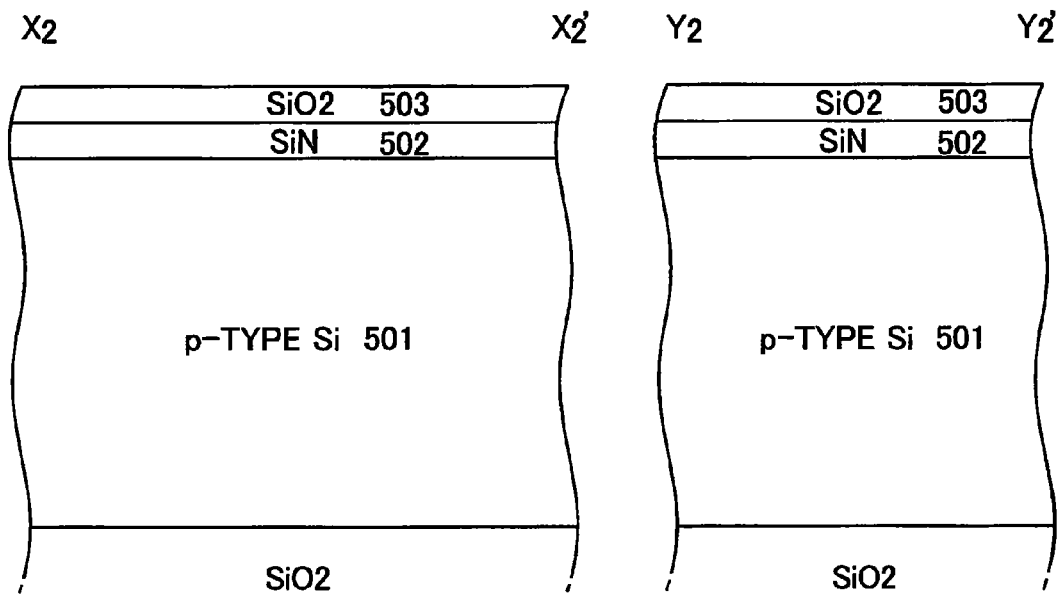
FIGS. 14(a) and 14(b) are, respectively, a sectional view ($X_2$-$X'_2$ section) and a sectional view ($Y_2$-$Y'_2$ section) showing a step in one example of a production method for a CMOS image sensor according to the present invention.
Figure 15:
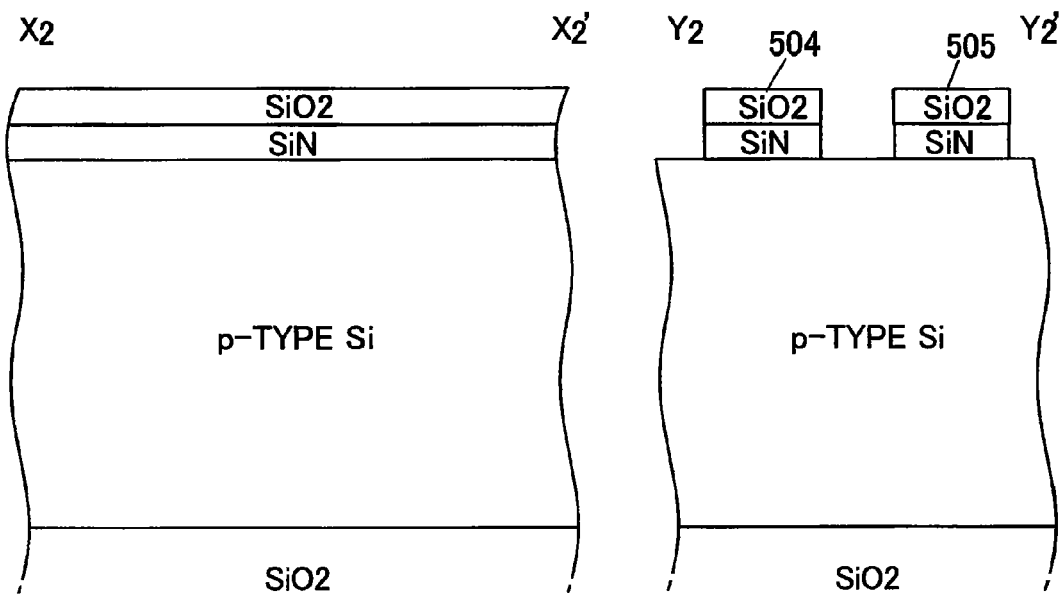
FIGS. 15(a) and 15(b) are, respectively, a sectional view ($X_2$-$X'_2$ section) and a sectional view ($Y_2$-$Y'_2$ section) showing a step in the example of the production method.
Figure 18:
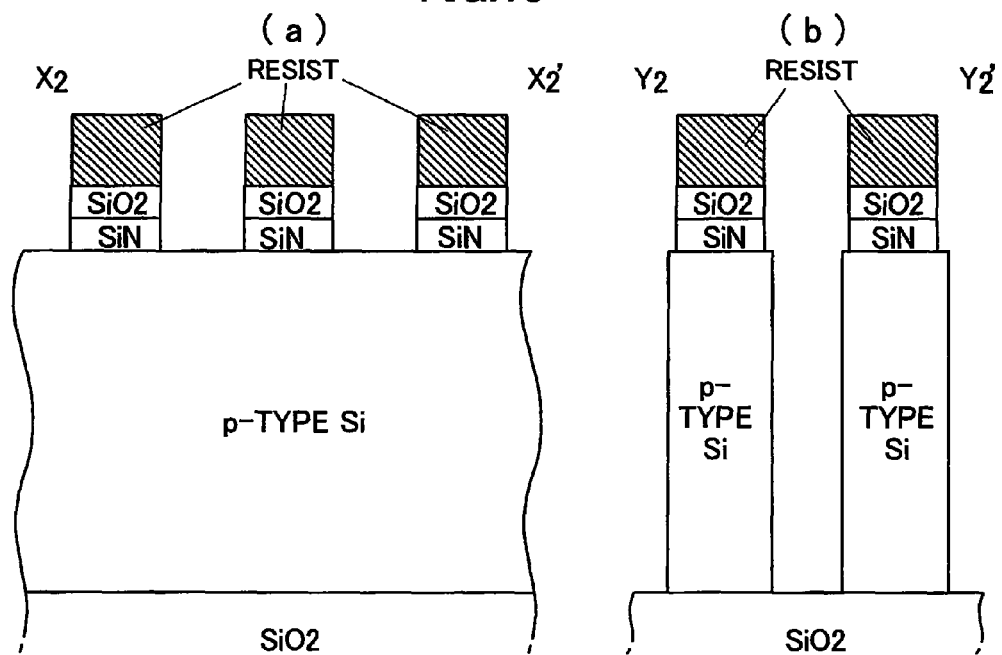
FIGS. 18(a) and 18(b) are, respectively, a sectional view ($X_2$-$X'_2$ section) and a sectional view ($Y_2$-$Y'_2$ section) showing a step in the example of the production method.
Figure 19:
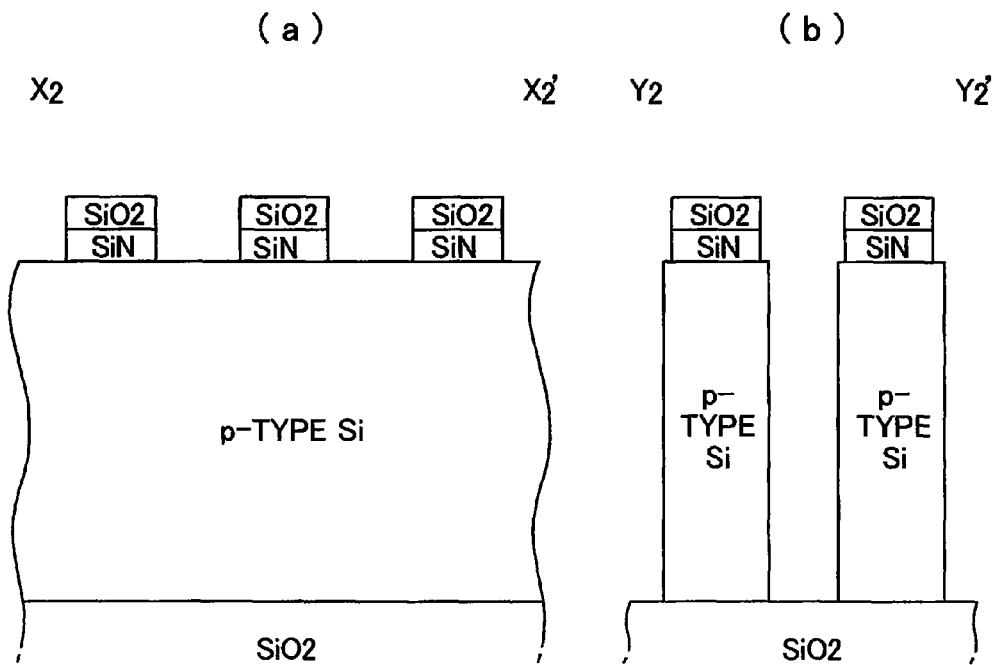
FIGS. 19(a) and 19(b) are, respectively, a sectional view ($X_2$-$X'_2$ section) and a sectional view ($Y_2$-$Y'_2$ section) showing a step in the example of the production method.
Figure 22:
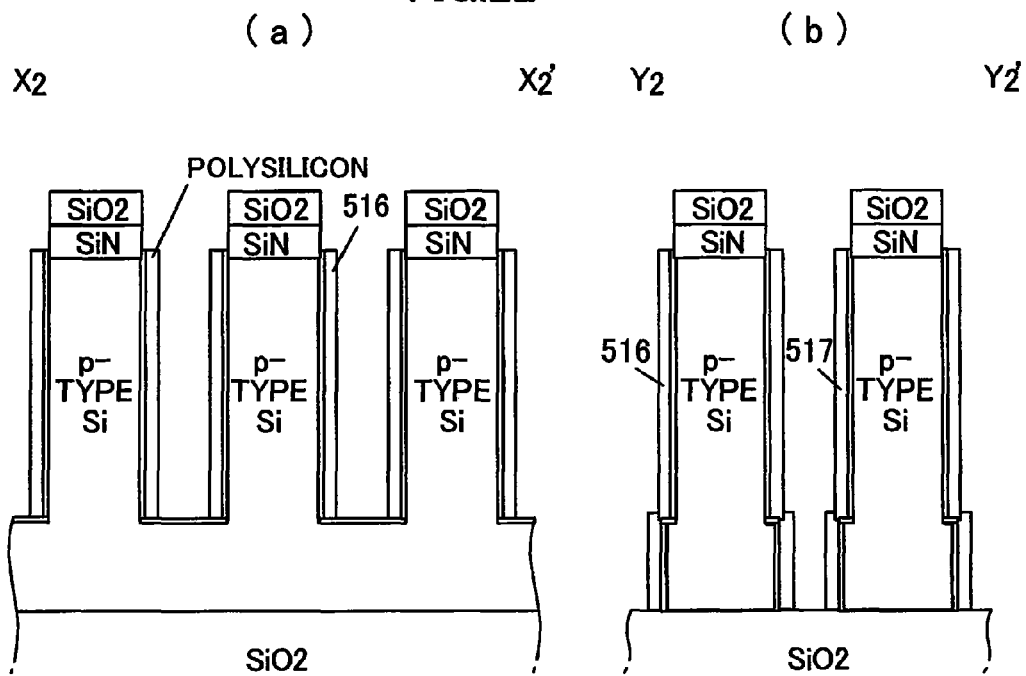
FIGS. 22(a) and 22(b) are, respectively, a sectional view ($X_2$-$X'_2$ section) and a sectional view ($Y_2$-$Y'_2$ section) showing a step in the example of the production method.
Figure 23:
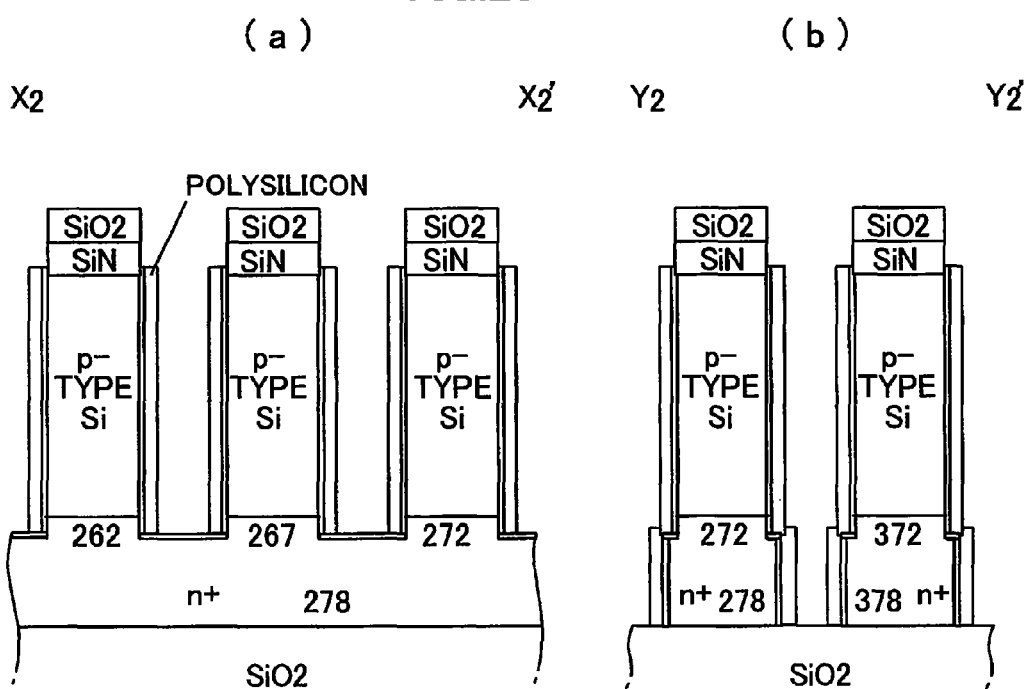
FIGS. 23(a) and 23(b) are, respectively, a sectional view ($X_2$-$X'_2$ section) and a sectional view ($Y_2$-$Y'_2$ section) showing a step in the example of the production method.
Figure 24:
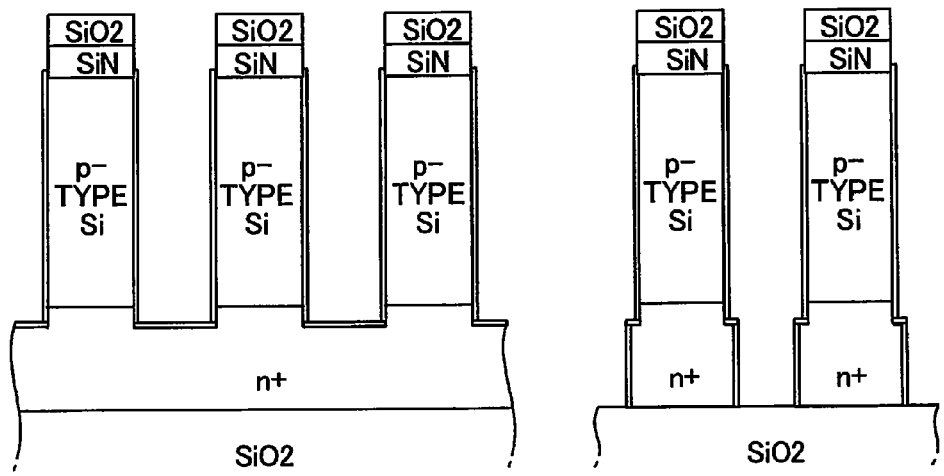
FIGS. 24(a) and 24(b) are, respectively, a sectional view ($X_2$-$X'_2$ section) and a sectional view ($Y_2$-$Y'_2$ section) showing a step in the example of the production method.
Figure 25:
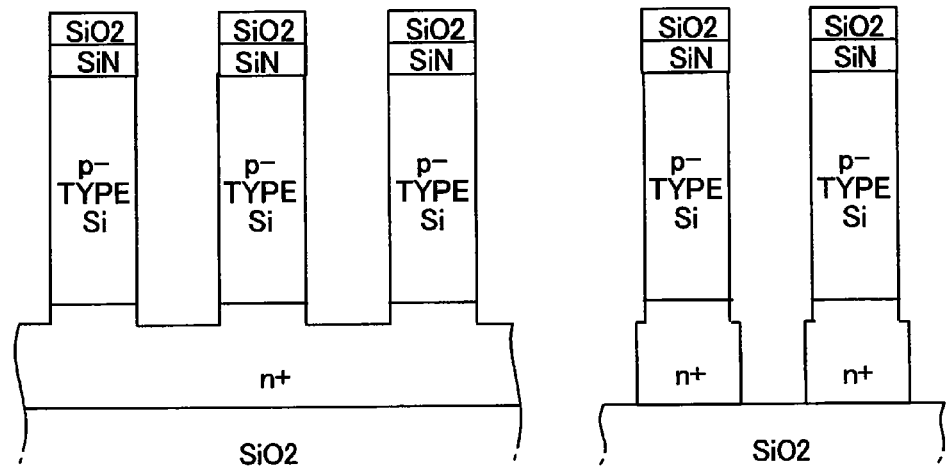
FIGS. 25(a) and 25(b) are, respectively, a sectional view ($X_2$-$X'_2$ section) and a sectional view ($Y_2$-$Y'_2$ section) showing a step in the example of the production method.
Figure 26:
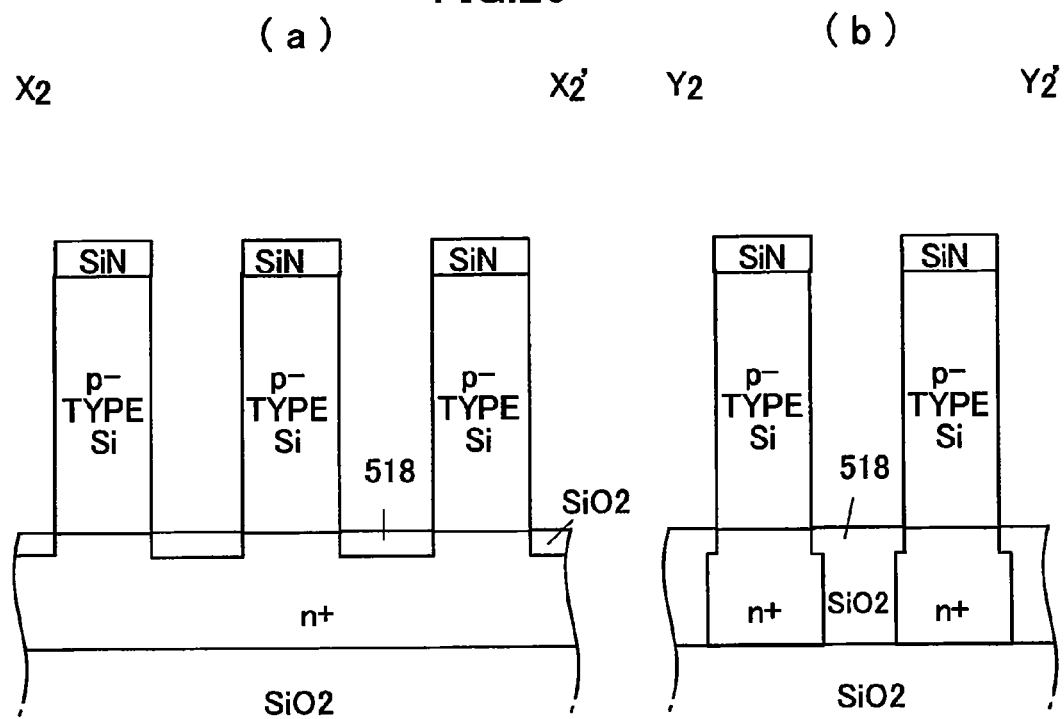
FIGS. 26(a) and 26(b) are, respectively, a sectional view ($X_2$-$X'_2$ section) and a sectional view ($Y_2$-$Y'_2$ section) showing a step in the example of the production method.
Figure 27:
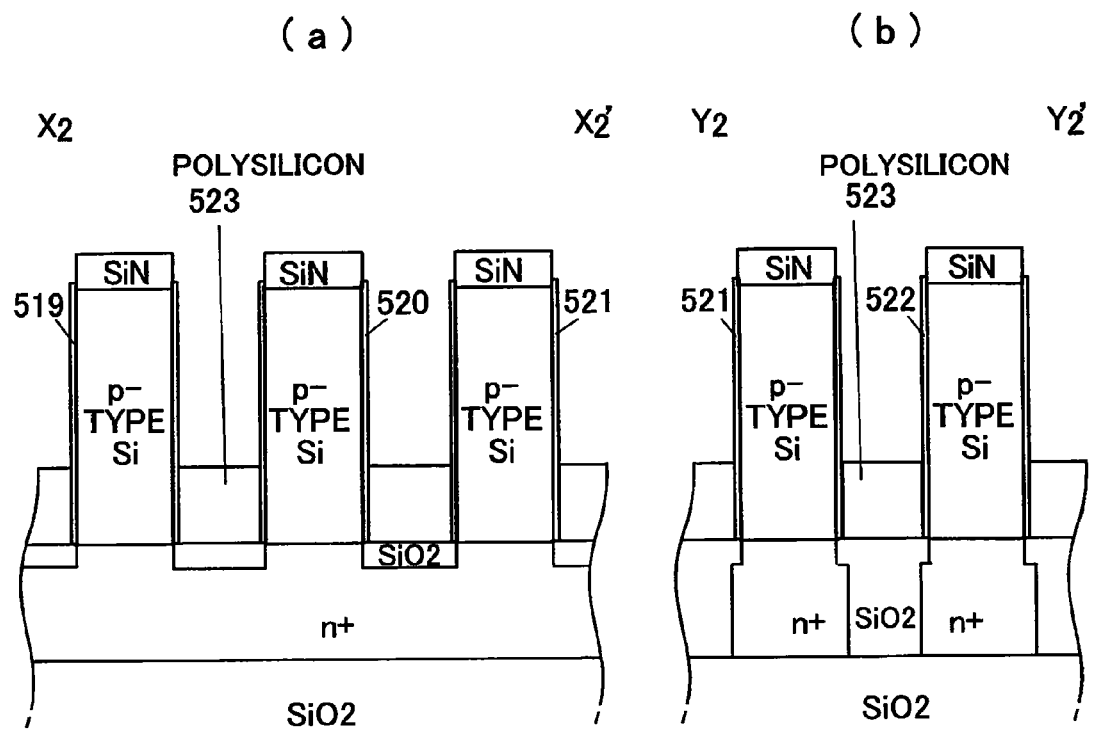
FIGS. 27(a) and 27(b) are, respectively, a sectional view ($X_2$-$X'_2$ section) and a sectional view ($Y_2$-$Y'_2$ section) showing a step in the example of the production method.
Figure 34:
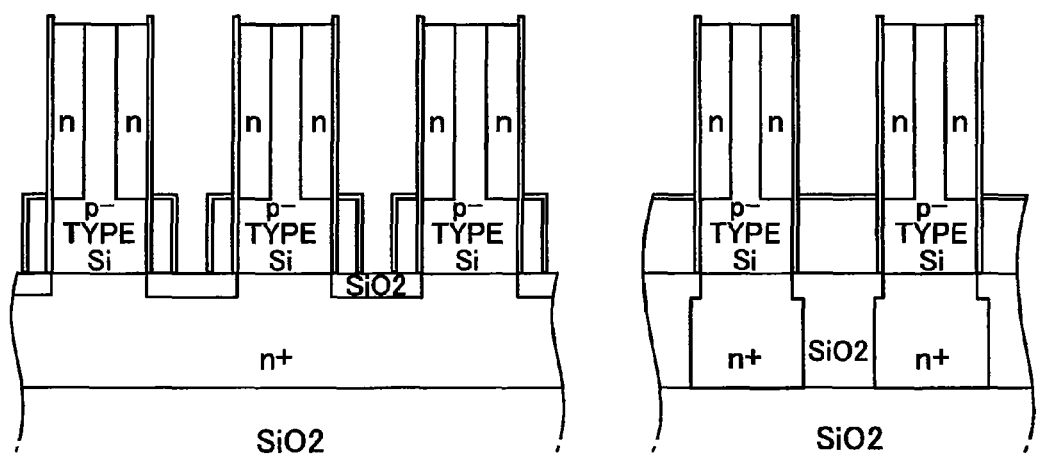
FIGS. 34(a) and 34(b) are, respectively, a sectional view ($X_2$-$X'_2$ section) and a sectional view ($Y_2$-$Y'_2$ section) showing a step in the example of the production method.
Figure 35:
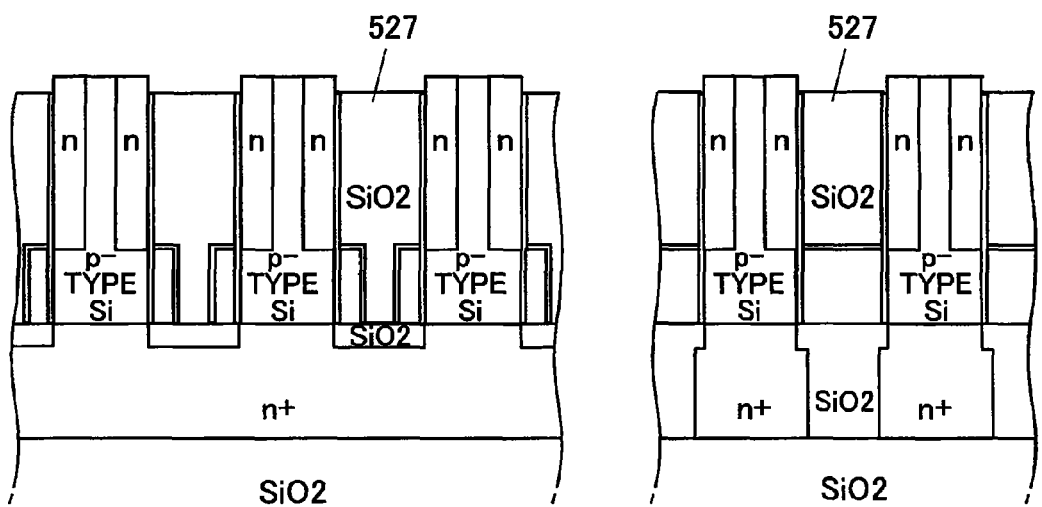
FIGS. 35(a) and 35(b) are, respectively, a sectional view ($X_2$-$X'_2$ section) and a sectional view ($Y_2$-$Y'_2$ section) showing a step in the example of the production method.
Figure 40:
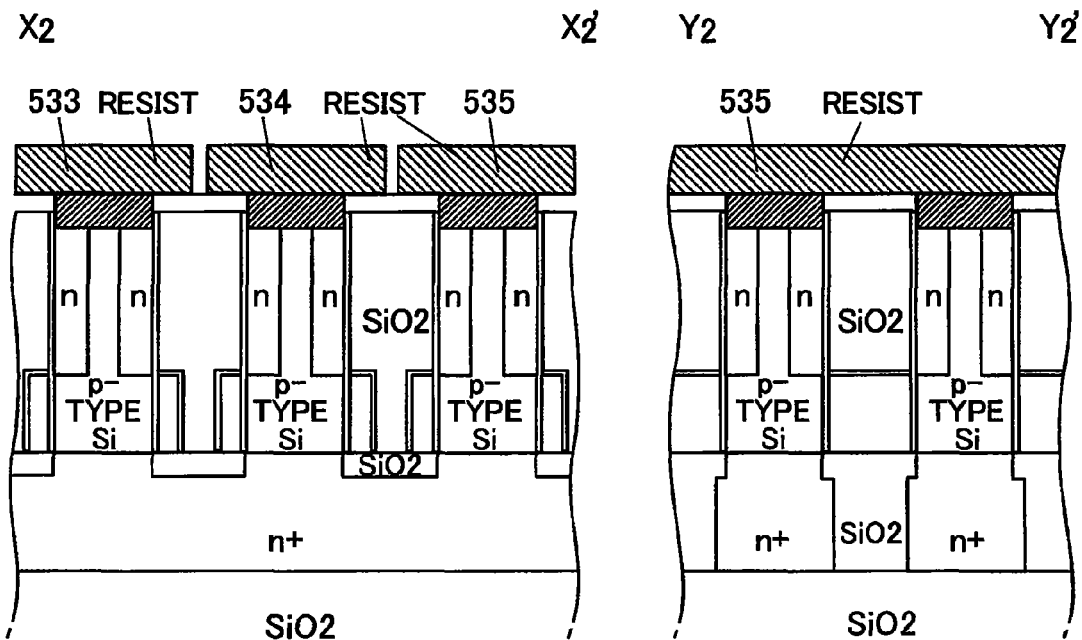
FIGS. 40(a) and 40(b) are, respectively, a sectional view ($X_2$-$X'_2$ section) and a sectional view ($Y_2$-$Y'_2$ section) showing a step in the example of the production method.
Figure 41:
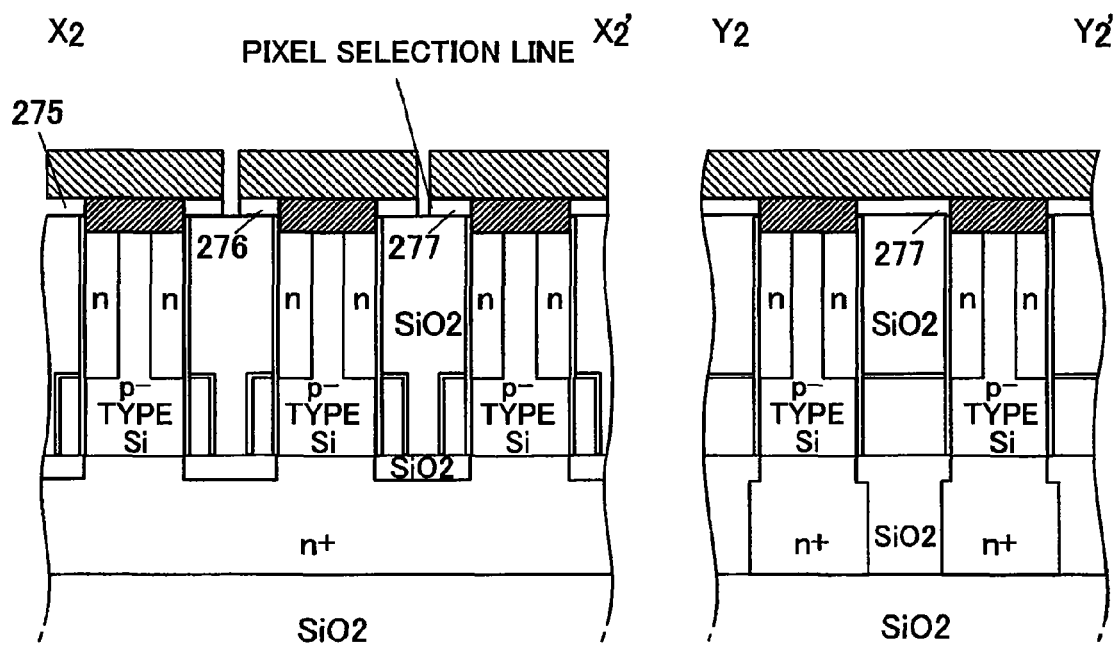
FIGS. 41(a) and 41(b) are, respectively, a sectional view ($X_2$-$X'_2$ section) and a sectional view (Y2-Y'2 section) showing a step in the example of the production method.

Then, 0V is applied to respective ones of the pixel selection line 404, the gate (reset line) 406 and the signal line 407, to convert a light signal incident onto the photodiode 401, into electric charges and store the converted signal charges in the charge storage section 402. Specifically, in response to receiving light, the voltage of the charge storage section is reduced (FIG. 12).

Then, $V_H$ (e.g., 1V) is applied to the pixel selection line 404, and 0V is applied to respective ones of the gate (reset line) 406, and the signal line 407, to produce a flow of readout current $I_{read}$ while amplifying the electric charges stored in the charge storage section 402, so as to perform a readout operation. Along with an increase in intensity of incident light, the voltage of the charge storage section 402 becomes lower to facilitate the current flow (FIG. 13(a)). If no light enters the photodiode, a voltage of the charge storage section 402 is maintained at $V_H$ (e.g., 1V), so that no current flows (FIG. 13(b)).

In the above driving method, after electric charges generated by a photoelectric conversion section made up of the photodiode are stored in the charge storage section, the stored electric charges can be amplified through an amplification section, and the amplified electric charges can be read out using the pixel selection section.

With reference to FIGS. 14(a) to 43(b), one example of a fabrication process for forming a structure of the solid-state imaging device according to the present invention will be described below.

FIGS. 14(a), 15(a), - - -, and 43(a) correspond to the $X_2$-$X'_2$ section in FIG. 6, and FIGS. 14(b), 15(b), - - -, and 43(b) correspond to the $Y_2$-$Y'_2$ section in FIG. 6.

FIGS. 14(a) and 14(b) are, respectively, the $X_2$-$X'_2$ section and the $Y_2$-$Y'_2$ section of a silicon-on-insulator (SOI) substrate where a silicon nitride (SiN) film 502 is deposited on a p-type silicon layer 501 formed on a silicon oxide film, and a silicon oxide film 503 is deposited on the silicon nitride film 502.

After forming a resist, the oxide film is etched, and the nitride film is etched. Then, the resist is removed to form a mask (504, 505) (FIGS. 15(a) and 15(b)).

The Si layer 501 is etched to form a signal line (278, 378) (FIGS. 16(a) and 16(b)).

A resist (506, 507, 508, 509, - - -) is formed (FIGS. 17(a) and 17(b)).

The oxide film and the nitride film are etched (FIGS. 18(a) and 18(b)).

The resist is removed (FIGS. 19(a) and 19(b)).

The Si layer is etched to form an island-shaped semiconductor (510, 511, 512, 513, - - -) (FIGS. 20(a) and 20(b)).

An oxidation treatment is performed to form an oxide film (514, 515) (FIGS. 21(a) and 21(b)).

Polysilicon is deposited and then etched in such a manner that it is left as a sidewall (516, 517) (FIGS. 22(a) and 22(b)).

Phosphorus (P) is ion-implanted, and then an annealing treatment is performed to form a P-doped signal line (278, 378) and an n+-type diffusion layer (262, 267, 272, 372, - - -) (FIGS. 23(a) and 23(b)).

The polysilicon is removed (FIGS. 24(a) and 24(b)).

The oxide film (514, 515) is removed (FIGS. 25(a) and 25(b)).

An oxide film is deposited, and, after being flattened, etched back to form an oxide film layer 518 (FIGS. 26(a) and 26(b)).

An oxidation treatment is performed to form a gate oxide film (519, 520, 521, 522, - - -). Then, polysilicon 523 is deposited, and, after being flattened, etched back (FIGS. 27(a) and 27(b)).

A resist (524, 525, 526) for a reset line is formed (FIGS. 28(a) and 28(b)).

The polysilicon is etched to form a gate (reset line) (263, 268, 273) (FIGS. 29(a) and 29(b)).

The resist is removed (FIGS. 30(a) and 30(b)).

After removing the thin oxide film on a sidewall of the Si pillar, the sidewall of the Si pillar, and the polysilicon gate, are surface-oxidized (FIGS. 31(a) and 31(b)).

Phosphorus (P) is ion-implanted to form an n-type diffusion layer (FIGS. 32(a) and 32(b)).

An annealing treatment is performed to form a charge storage layer (264, 269, 274, 374, - - -) (FIGS. 33(a) and 33(b)).

The nitride film is removed (FIGS. 34(a) and 34(b)).

An oxide film is deposited, and, after being flattened, etched back to form an oxide film layer 527 (FIGS. 35(a) and 35(b)).

An oxidation treatment is performed to form an oxide film (528, 529, 530, 531, - - -) (FIGS. 36(a) and 36(b)).

Boron (B) is implanted, and then an annealing treatment is performed to form a p+-type diffusion layer (260, 265, 270, 370, - - -) (FIGS. 37(a) and 37(b)).

The oxide film is removed (FIGS. 38(a) and 38(b)).

A metal 532 is deposited, and, after being flattened, etched back (FIGS. 39(a) and 39(b)).

A resist (533, 534, 535) for a pixel selection layer is formed (FIGS. 40(a) and 40(b)).

The metal is etched to form the pixel selection layer (275, 276, 277) (FIGS. 41(a) and 42(b)).

The resist is removed (FIGS. 42(a) and 42(b)).

A surface protection film 536 is formed (FIGS. 43(a) and 43(b)).

The solid-state imaging device according to the first embodiment employs a structure where the charge storage section surrounds the p-type impurity-doped region, and the gate surrounds the p-type impurity-doped region through the insulating film.

Figure 44:
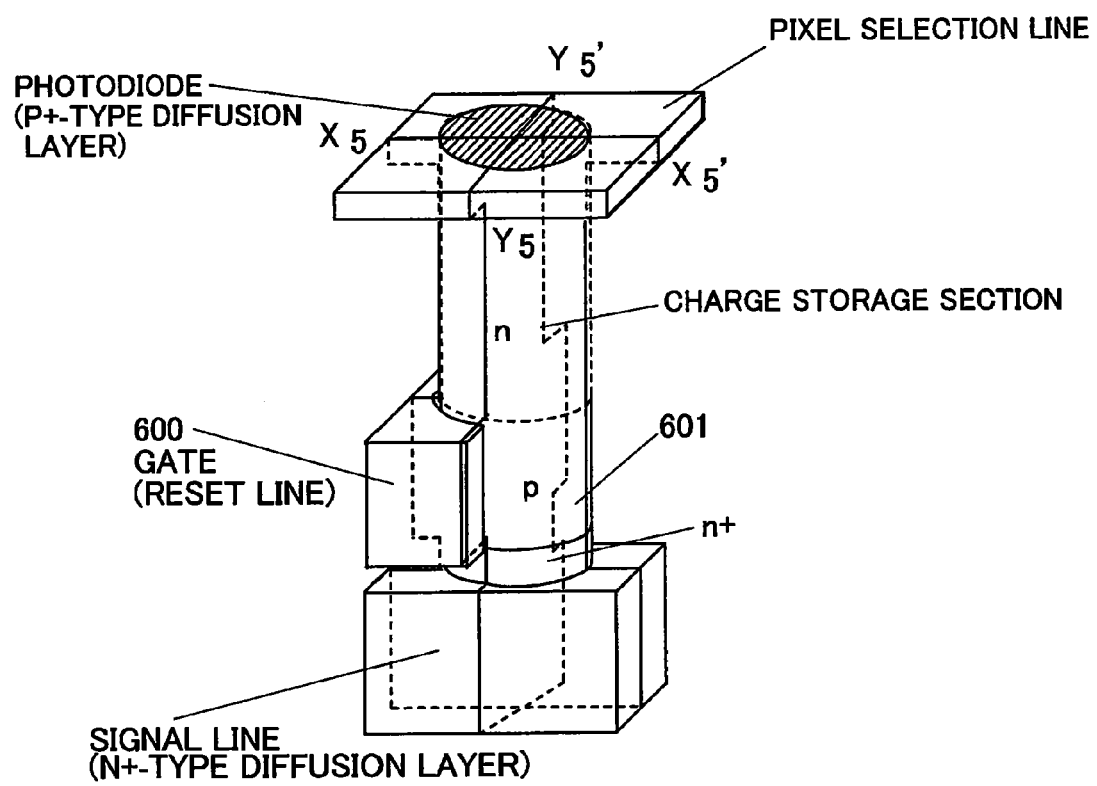
FIG. 44 is a perspective view showing a solid-state imaging device according to a second embodiment of the present invention.

Alternatively, as shown in FIG. 44, a gate 600 may be formed to surround a part of a p-type impurity-doped region 601 through an insulating film.

Figure 46:
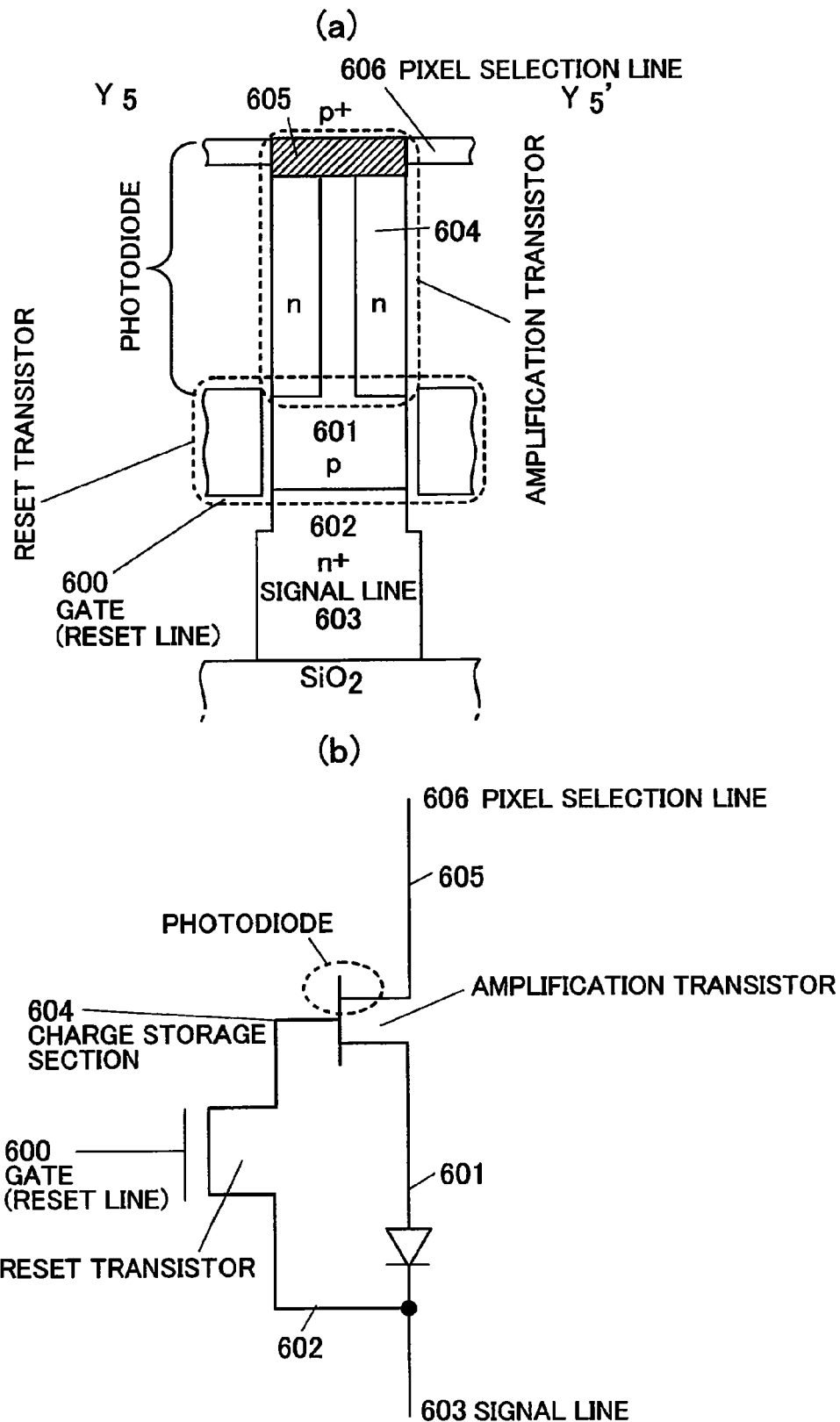
FIG. 46(a) is a sectional view taken along the line $Y_5$-$Y'_5$ in FIG. 44.
FIG. 46(b) is a schematic diagram showing an equivalent circuit of the cross-sectional structure in FIG. 46(a).

FIG. 44 is a perspective view showing a second embodiment of the present invention. FIG. 45(a) is a sectional view taken along the line $X_5$-$X'_5$ in FIG. 44, and FIG. 45(b) is a schematic diagram showing an equivalent circuit of the cross-sectional structure in FIG. 45(a). FIG. 46(a) is a sectional view taken along the line $Y_5$-$Y'_5$ in FIG. 44, and FIG. 46(b) is a schematic diagram showing an equivalent circuit of the cross-sectional structure in FIG. 46(a).

Specifically, a solid-state imaging device according to the second embodiment comprises: an island-shaped semiconductor formed on a Si substrate; a p+-type diffusion layer 605, a p-type impurity-doped region 602 and an n+-type diffusion layer 602 each formed in the island-shaped semiconductor; a charge storage section 604 comprised of an n-type diffusion layer connected to the p-type impurity-doped region and adapted, in response to receiving light, to undergo a change in amount of electric charges therein; a gate 600 connected to the p-type impurity-doped region through an insulating film; and a pixel selection line 606 connected to the p+-type diffusion layer formed as a top portion of the island-shaped semiconductor.

Figure 47:
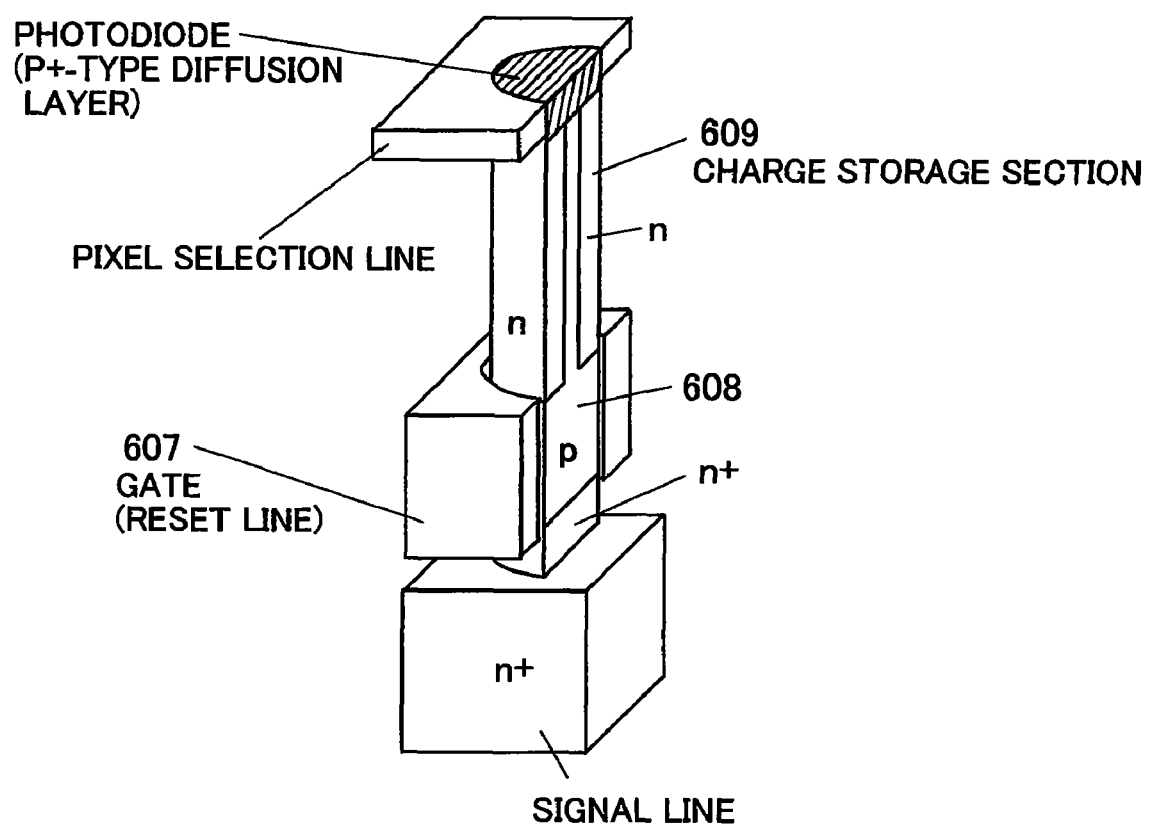
FIG. 47 is a perspective view showing a solid-state imaging device according to a third embodiment of the present invention.

FIG. 47 shows a third embodiment of the present invention. As shown in FIG. 47, a charge storage section 609 may be formed to surround a part of a p-type impurity-doped region 608, and a gate 607 may be formed to surround a part of the p-type impurity-doped region 608 through an insulating film.

As described above, a unit pixel of the conventional CMOS image sensor has a photodiode and three MOS transistors in a plane. This means that it is difficult to achieve a high degree of pixel integration.

In contrast, in the present invention, an island-shaped semiconductor is formed on a Si substrate, and a p+-type diffusion layer, a p-type impurity-doped region and an n+-type diffusion layer are formed in the island-shaped semiconductor. A charge storage section is comprised of an n-type diffusion layer connected to the p-type impurity-doped region and adapted, in response to receiving light, to undergo a change in amount of electric charges therein, and a gate is connected to the p-type impurity-doped region through an insulating film.

Further, a pixel selection line is connected to the p+-type diffusion layer formed as a top portion of the island-shaped semiconductor, and an n+-type diffusion layer is formed underneath the island-shaped semiconductor to serve as a signal line.

In the above solid-state imaging device, a combination of the p+-type diffusion layer and the n-type diffusion layer functions as a photoelectric-conversion photodiode. Further, a combination of the p+-type diffusion layer, the n-type diffusion layer and the p-type impurity-doped region functions as an amplification transistor, and a combination of the n+-type diffusion layer, the p-type impurity-doped region, the n-type diffusion layer and the gate functions as a reset transistor.

This structure makes it possible to form a photoelectric-conversion section, an amplification section, a pixel selection region and a reset section, i.e., a unit pixel of a CMOS image sensor, in an area of $4F^2$ (F: minimum fabrication size) to achieve a CMOS image sensor with a high degree of pixel integration.

What is claimed is:

1. A solid-state imaging device comprising an MOS transistor, a photo-diode for accumulating electric charges generated by light irradiation and an amplification transistor, the device further comprising:
   a signal line on a substrate;
   an island-shaped semiconductor on the signal line and extending vertically above the substrate;
   wherein the MOS transistor includes a semiconductor region in the island-shaped semiconductor, a dielectric film overlying the semiconductor region, and a gate conductor layer on an outer periphery of the island-shaped semiconductor and separated therefrom by the dielectric film,
   active elements of the photo-diode are connected to the MOS transistor and reside in the outer periphery of the island-shaped semiconductor, and
   a center portion of the island-shaped semiconductor is surrounded by the active elements of the photo-diode and the central portion of the island-shaped semiconductor comprises a channel of the amplification transistor; and
   a semiconductor layer is-connected to a pixel selection line on the top of the amplification transistor.

2. A solid-state imaging device comprising:
   a signal line on a substrate;
   an island-shaped semiconductor on the signal line; and
   a pixel selection line, wherein the island-shaped semiconductor includes:
     a first semiconductor layer providing a bottom portion of the island-shaped semiconductor and connected to the signal line;
     a second semiconductor layer above and adjacent to the first semiconductor layer and having a first portion and a second thereof in a cross-sectional circular pillar shape, a polarity of the second semiconductor layer being different from one of the first semiconductor layer;
     a gate and an insulating film arranged on the surface of the second semiconductor layer;
     a charge storage section comprised of a third semiconductor layer surrounding an outer periphery of the second portion of the second semiconductor layer connected to the second semiconductor layer and adapted, in response to receiving light, to undergo a change in amount of electric charges therein, a polarity of the third semiconductor layer being different from one of the second semiconductor layer; and
     a fourth semiconductor layer above and adjacent to the second and third semiconductor layers, a polarity of the fourth semiconductor layer being identical with one of the second semiconductor layer,
     and wherein the pixel selection line is connected to the fourth semiconductor layer as a top portion of the island-shaped semiconductor.

3. The solid-state imaging device according to claim 2, wherein:
   a combination of the third semiconductor layer and the fourth semiconductor layer comprise a photoelectric-conversion photodiode and an electric charge accumulation diode;
   a combination of the second semiconductor layer, the third semiconductor layer and the fourth semiconductor layer comprise an amplification transistor; and
   a combination of the first semiconductor layer, the second semiconductor layer, the third semiconductor layer and the gate comprise a reset transistor.

4. The solid-state imaging device according to claim 2, wherein the gate surrounds an outer periphery of the first portion of the second semiconductor layer and is spaced apart therefrom by the insulating film.

5. A solid-state imaging device array comprising a plurality of the solid-state imaging devices according to claim 1, which are arranged on the substrate in an n-row by m-column array, wherein each of n and m is an integer of 1 or more.

6. A solid-state imaging device array comprising a plurality of the solid-state imaging devices according to claim 2, which are arranged on a substrate in an n-row by m-column array, wherein each of n and m is an integer of 1 or more.

7. A solid-state imaging device comprising:
   an amplification transistor including an island-shaped semiconductor surrounded by active elements and a central portion of the island-shaped semiconductor comprising a channel of the amplification transistor, wherein a gate and a source of the amplification transistor comprise a photodiode for photoelectric conversion and the gate of the amplification transistor comprises a charge storage section, the amplification transistor further comprising a junction transistor that amplifies a charge of the charge storage section,
   a reset transistor, having a source connected to the gate of the amplification transistor, the reset transistor comprising an MOS transistor that resets the charge storage section,
   a diode having an anode comprising a doped region connected to a drain of the amplification transistor and a cathode connected to a drain of the reset transistor,
   a pixel selection line connected to a source of the amplification transistor, and
   a signal line connected to the cathode of the diode and a drain of the reset transistor.

8. A method of driving a solid-state imaging device comprising the steps of:
   providing a solid state imaging device according to claim 2;
   applying a first drive voltage to the pixel selection line;
   applying a second drive voltage to the signal line; and
   applying a third drive voltage to the gate, to reset the charge storage section.

9. A method of driving a solid-state imaging device comprising the steps of:
   providing a solid state imaging device according to claim 7;
   applying a first drive voltage to the pixel selection line;
   applying a second drive voltage to the signal line;
   and applying a third drive voltage to the gate, to reset the charge storage section.

10. The method according to claim 8, which further comprises the step of receiving light, while applying the first drive voltage to respective ones of the pixel selection line, the gate and the signal line, to change an amount of electric charges stored in the charge storage section.

11. The method according to claim 9, which further comprises the step of receiving light, while applying the first drive voltage to respective ones of the pixel selection line, the gate and the signal line, to change an amount of electric charges stored in the charge storage section.

12. The method according to claim 8, which further comprises the steps of:
   applying the second drive voltage to the pixel selection line, applying the first drive voltage to the gate and applying the first drive voltage to the signal line, to produce a flow of readout current while amplifying the electric charges stored in the charge storage section and, so as to perform a readout operation.

13. The method according to claim 9, which further comprises the steps of:
applying the second drive voltage to the pixel selection line, applying the first drive voltage to the gate and applying the first drive voltage to the signal line, to produce a flow of readout current while amplifying the electric charges stored in the charge storage section and, so as to perform a readout operation.

14. The method according to claim 10, wherein:
the first drive voltage is set at zero V;
the second drive voltage is set at 1 V; and
the third drive voltage is set at 1.5 V.

* * * * *

UNITED STATES PATENT AND TRADEMARK OFFICE
CERTIFICATE OF CORRECTION

PATENT NO. : 8,330,089 B2
APPLICATION NO. : 12/700294
DATED : December 11, 2012
INVENTOR(S) : Fujio Masuoka et al.

Page 1 of 1

It is certified that error appears in the above-identified patent and that said Letters Patent is hereby corrected as shown below:

In the Claims

In column 11, claim 1, line 18, before "portion of the island-shaped" replace "center" with --central--.

In column 11, claim 1, line 23, after "a semiconductor layer" replace "is-connected" with --connected--.

Signed and Sealed this
Fifteenth Day of October, 2013

Teresa Stanek Rea
*Deputy Director of the United States Patent and Trademark Office*